United States Patent
Li

(10) Patent No.: US 7,357,550 B2
(45) Date of Patent: *Apr. 15, 2008

(54) LED ILLUMINATION ENGINE USING A REFLECTOR

(75) Inventor: Kenneth K. Li, Arcadia, CA (US)

(73) Assignee: Wavien, Inc., Valencia, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/154,359

(22) Filed: Jun. 14, 2005

(65) Prior Publication Data

US 2005/0248958 A1 Nov. 10, 2005

Related U.S. Application Data

(63) Continuation of application No. 10/226,237, filed on Aug. 23, 2002, now Pat. No. 6,926,435.

(60) Provisional application No. 60/314,091, filed on Aug. 23, 2001, provisional application No. 60/324,512, filed on Sep. 26, 2001.

(51) Int. Cl.
*F21V 7/04* (2006.01)
(52) U.S. Cl. .................. 362/555; 362/269; 362/304; 362/305
(58) Field of Classification Search .......... 362/296, 362/297, 304, 305, 346, 551, 555, 558, 560, 362/561, 345; 353/30, 34, 98, 99
See application file for complete search history.

(56) References Cited

U.S. PATENT DOCUMENTS 4,767,172 A * 8/1988 Nichols et al. ............ 385/146
6,318,863 B1 * 11/2001 Tiao et al. ................ 353/31
6,946,682 B2 * 9/2005 Slater, Jr. et al. ........... 257/79

* cited by examiner

*Primary Examiner*—John Anthony Ward
(74) *Attorney, Agent, or Firm*—Fulbright & Jaworski LLP

(57) ABSTRACT

An illumination engine for a projection display using light emitting diodes (LEDs) that includes a reflector having a first and second focal points, a source of electro-luminescence located proximate to the first focal point to emit rays of radiation in a first range of wavelengths that reflect from the reflector and converge substantially at the second focal point, and a light pipe having an first input end and a first output end, the first input end being located proximate to the second focal point to collect substantially all of the radiation and wherein the first output end transmits substantially all of the radiation. The illumination system may further include a substrate having a first side, a platform disposed proximate to the first side of the substrate, and a plurality of reflectors each having a first and second focal points disposed in the platform, each of the first and second focal points disposed proximate to the first side of the substrate, a plurality of sources of electro-luminescence disposed on the first side of the substrate, each of the sources of electro-luminescence disposed substantially coincident with a corresponding one of the first focal points to emit rays of electromagnetic radiation that reflect from a corresponding one of the plurality of reflectors and converges substantially at a corresponding one of the second focal points, a plurality of light pipes disposed in the substrate, each of the light pipes having an input end and an output end, each of the input ends disposed substantially coincident with a corresponding one of the second focal points to collect substantially all of the radiation, wherein each of the output ends transmits substantially all of the radiation emitted by a corresponding one of the plurality of sources.

10 Claims, 30 Drawing Sheets

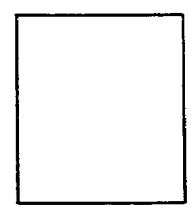
FIG. 27A
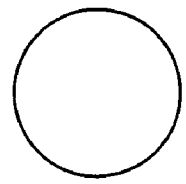
FIG. 27B
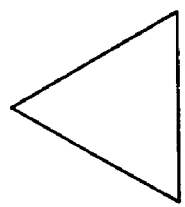
FIG. 27C
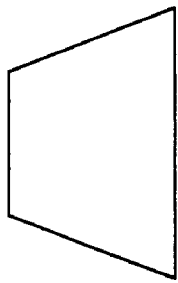
FIG. 27D
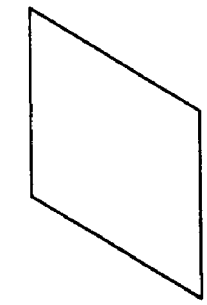
FIG. 27E
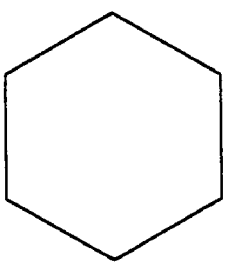
FIG. 27F
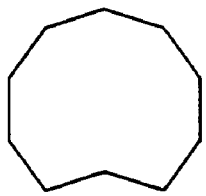
FIG. 27G
FIG. 27H

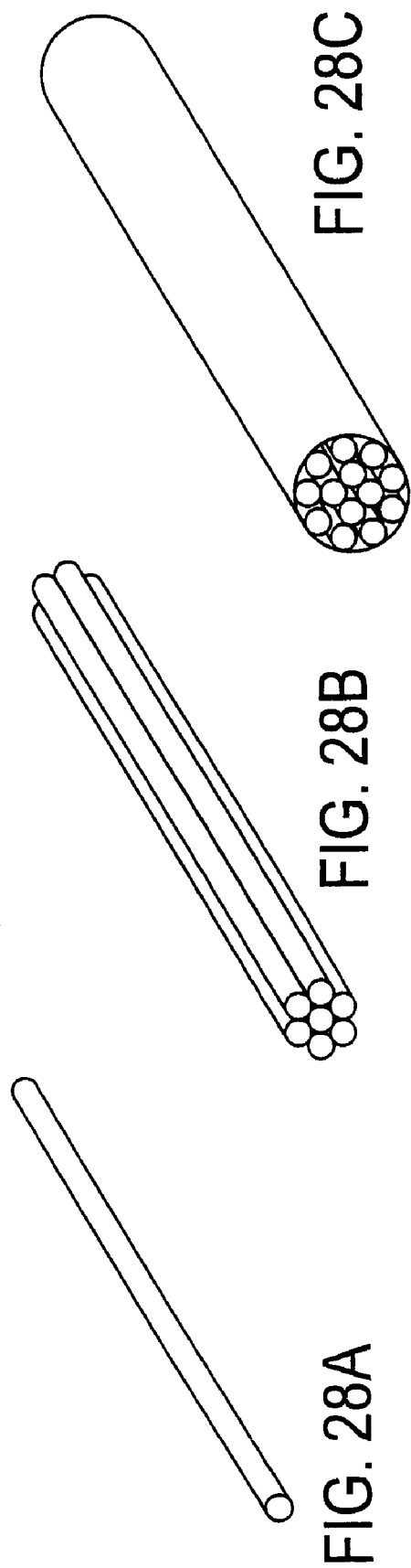
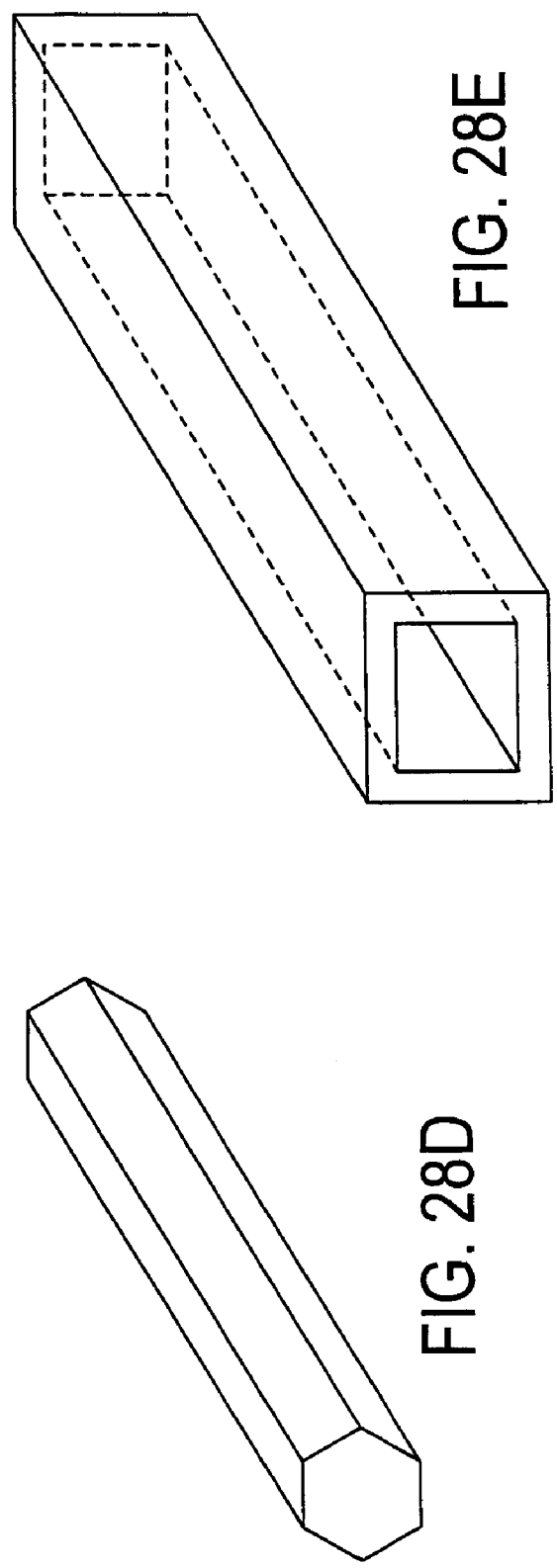
FIG. 28A
FIG. 28B
FIG. 28C
FIG. 28D
FIG. 28E

LED ILLUMINATION ENGINE USING A REFLECTOR

CROSS-REFERENCE TO RELATED APPLICATIONS

This is a continuation application of patent application Ser. No. 10/226,237 filed Aug. 23, 2002, now U.S. Pat. No. 6,926,435 which claims priority to Provisional Applications Ser. Nos. 60/314,091, filed Aug. 23, 2001, and 60/324,512, filed Sep. 26, 2001, the disclosures of which are incorporated by reference.

BACKGROUND OF THE INVENTION

1. Field of Invention

This invention relates to projection displays, and specifically to illumination engines for projection displays.

2. Description of the Related Art

There are several major kinds of display. These displays vary significantly both in the amount of space they require and their cost. The most common type of display is the cathode ray tube (C RT) display. CRTs are inexpensive and bright, but require a large amount of space. Another common kind of display is the direct view liquid crystal display (LCD) panel. Although LCD panels with small display areas are relatively inexpensive, those with larger display areas may cost several times as much as a comparable CRT display. As a result, LCD panels are not as popular as CRTs, unless space is at a premium. Thus, LCD panels are often used in crowded areas, e.g. restaurant cashier counters. It would be desirable for an image projection system to be compact and inexpensive.

For larger displays, two types of displays are most prominent: plasma display panels and projection displays. Plasma display panels are thin, and thus occupy only a small amount of space. Their resolution, however, is not as high as that of a comparable projection display. In addition, plasma displays are quite expensive. Plasma display panels are therefore not as popular as the other types of displays. It would be desirable for an image projection system to have high resolution and be inexpensive.

Projection displays work by shining light from an illumination engine, such as a white light from an arc or a filament lamp, onto an imager, such as a digital micro-mirror device (DMD), an LCD, or an liquid crystal on silicon (LCOS) chip. The imager may be modulated with an image signal to control its reflection and transmission properties. The imager may respond to the image signal by either reflecting or transmitting the light to create an image.

Much work has been done on projection displays using small display imagers such as DMD displays, LCDs, and LCOS displays. Such displays, however, require expensive illumination engines. While these displays provide advantages for displays with large screens, these displays are not used as widely in displays with small screens, due to the high cost of the illumination engine. Therefore, there exists a need for a compact and low cost illumination engine that can be applied to smaller displays, such as those of 10" to 35". These displays could be used in, e.g. computer monitors and small televisions since they will occupy a small amount of space. With the advancement in the LED technologies, future high lumen output LEDs can have a potential of illuminating a large screen television in the 60" range.

A color signal may be fed into the imager of the projection system in synchronism with the colors incident on the imager such that the output picture on the screen will be sequentially illuminated with the three colors. The eye retains the colors, merging the colors and giving an impression of an overall color picture.

Arc lamps and filament lamps, which are traditionally used as sources of radiation in such systems, have relatively short life spans. A light emitting diode (LED), in contrast, may have a lifetime of 100,000 hours, which is 20 to 50 times longer than an arc lamp. It would be desirable to be able to use an LED, or an array of LEDs, as a source of illumination in an image projection system.

FIG. 1 shows an LED 1 light source for use with an embodiment of the invention. An LED is an example of a device that produces light by electro-luminescence. An LED may be, e.g., a forward biased p-n junction. When an electric current is applied to the LED, minority carriers are injected into regions of the crystal where they can recombine with majority carriers, such as in the transition region and in the neutral regions near the p-n junction. The carriers emit radiation upon recombination. In materials characterized by direct recombination, such as e.g. Zinc Sulfide (ZnS), Gallium Arsenide (GaAs), Indium Antimony (InSb), Gallium Phosphorus (GaP), and, Gallium Nitride (GaN), the radiation may include a significant portion of visible light. This effect may be termed injection electro-luminescence.

The LED 1 may be mounted on a substrate 2, which may be insulating and a good conductor of heat, such as a Beryllium Oxide (BeO) substrate. Metal tracks 3, 5 or rails on top of the substrate 2 provide an electrical connection between the LED 1 and the other parts of the circuit. An LED 1 may have electrodes on the top and the bottom. An LED 1 may be soldered to one of the metal tracks 3 on the substrate, which forms one contact. The other contact is formed by wire bonding 4 the electrode on top of the LED 1 to another metal track 5 on the substrate. In the alternative, solder bumps may be used for soldering to the substrate instead of wire bonding. When an electrical current is applied to the LED 1, radiation is emitted.

An LED will generally emit radiation having a relatively narrow range of bandwidths due to the intrinsic properties of the LED materials. As a result, the output of the LEDs will normally be colored. LEDs that emit radiation in all of the colors from infrared to ultraviolet are readily available. Color LEDs are customarily used for indicators, while white LEDs are often used for general illumination. One of the common usages for color LEDs is for traffic lights.

The light source in a projection system should have a small etendue. As a result, a good collection and condensing system is required to collect the light from the light source and condense the light into the target. In the case of LEDs, most LEDs are packed into epoxy lenses, which increase the etendue of the LED.

On the other hand, if white LEDs are used, the output is directly compatible to an arc lamp illumination system, but the increase in the size of the emission area due the application of phosphor may increase the etendue, thus reducing brightness. Either or both of these schemes can be used depending on the system requirements.

Radiation of different colors produced by several LEDs may be combined to produce other colors or a net white output. The output of several LEDs may be combined by mixing their output in an homogenizer. In the alternative, a lens formed of clear epoxy 6 and a thin layer of white phosphor 7 may be applied to the top of an LED 1 which produces blue or UV radiation to 'whiten' the radiation, as shown in FIG. 2. In another embodiment, clear epoxy 6 may be replaced by white phosphor. For a sequential color projection system, each color may be turned on in sequence such that their outputs are synchronized with an imager in a projection system. This will produce an overall color display.

The radiation output from a plurality of LEDs may be combined to illuminate a screen. It is estimated that 10 to 30 LEDs of the types available in the market today would be needed to illuminate a screen on the order of 10" to 21", depending on the output intensity of the LEDs. As the output of the LEDs increases with the advancement of the technology, fewer LEDs will be needed. The total output etendue of the LEDs should match the etendue of the imager chip. For example, a 0.25 $mm^2$ chip emitting in a hemisphere has an etendue of approximately E=0.25. For a 0.5" imager chip at F/3.0, the etendue is approximately E=6.75. Thus, if there is no loss of etendue from the LEDs to the imager, a total of 6.75/0.25=27 LEDs can be used.

At present, although LEDs with output of over 100 lumens has been reported, the average output from a commonly available LED is about 20 lumens. Twenty-seven LEDs would thus produce a total of about 540 lumens. This would be sufficient for smaller displays, even after considering the loss budget of various components. LEDs may be expected to produce more lumens as the technology advances.

The light incident on the imager may be, e.g. filtered to produce a color image. Three primary colors, such as, e.g. red, green, and blue, may be fed to the imager by, e.g. filtering the light incident on the imager with, e.g. a rotating color wheel. Rotating color wheels are comprised of, e.g. red, green, and blue filters arranged about an axis and caused to rotate in the light. As each of the filters intersects the light incident on the imager, two of the colors will be filtered out while the third is transmitted. Rotating color wheels are simple and inexpensive, but incur losses due to the filtering. Furthermore, they require space for the motor. It would be desirable for a compact source of radiation to produce colored light with relatively low filtering losses.

SUMMARY OF THE INVENTION

In a first embodiment, an illumination engine for a projection display using light emitting diodes (LEDs) includes a first reflector having a first and second focal points, a first source of electro-luminescence located proximate to the first focal point to emit rays of radiation in a first range of wavelengths that reflect from the first reflector and converge substantially at the second focal point, and a first light pipe having an first input end and a first output end, the first input end being located proximate to the second focal point to collect substantially all of the radiation and wherein the first output end transmits substantially all of the radiation.

In a second embodiment, an illumination system for a projection display using light emitting diodes (LEDs) includes first and second sources of electro-luminescence, a first homogenizer having a first input end and a first output end, a second homogenizer having a second input end and a second output end, a primary reflector having a first focal point and a first optical axis, a secondary reflector having a second focal point and a second optical axis which is placed substantially symmetrically to a primary reflector such that a first and second optical axes are substantially collinear, a third reflector having a third focal point and a third optical axis, a fourth reflector having a fourth focal point and a fourth optical axis which is placed substantially symmetrically to a third reflector such that a third and fourth optical axes are substantially collinear.

The first source of electro-luminescence is located proximate to the first focal point to emit rays of radiation in a first range of wavelengths that reflect from the primary reflector toward the secondary reflector and substantially converge at the second focal point. The second source of electro-luminescence is located proximate to the third focal point to emit rays of radiation in a second range of wavelengths that reflect from the third reflector toward the fourth reflector and substantially converge at the fourth focal point. The first input end is located proximate to the second focal point to collect substantially all of the radiation of the first range of wavelengths and transmit it via the first output end, and the second input end is located proximate to the fourth focal point to collect substantially all of the radiation of the second range of wavelengths and transmit it via the second output end.

In a third embodiment, an illumination system for a projection display using light emitting diodes (LEDs) includes a substrate having a first side, a platform disposed proximate to the first side of the substrate, a plurality of reflectors each having a first and second focal points disposed in the platform, each of the first and second focal points disposed proximate to the first side of the substrate, a plurality of sources of electro-luminescence disposed on the first side of the substrate, each of the sources of electro-luminescence disposed substantially coincident with a corresponding one of the first focal points to emit rays of electromagnetic radiation that reflect from a corresponding one of the plurality of reflectors and converges substantially at a corresponding one of the second focal points, a plurality of light pipes disposed in the substrate, each of the light pipes having an input end and an output end, each of the input ends disposed substantially coincident with a corresponding one of the second focal points to collect substantially all of the radiation, wherein each of the output ends transmits substantially all of the radiation emitted by a corresponding one of the plurality of sources.

In a fourth embodiment, a method for using light emitting diodes (LEDs) in a projection display is performed by positioning a source of electro-luminescent radiation at a first focal point of a reflector, producing rays of radiation by the source, reflecting the rays of radiation by the reflector toward a second focal point of the reflector, converging the rays of radiation at the second focal point, positioning a light pipe having an input end and output end so the input end is substantially proximate to the second focal point, collecting the rays of radiation at the input end, passing the rays of radiation through the light pipe, and outputting rays of radiation from the output end of the light pipe.

BRIEF DESCRIPTION OF THE SEVERAL VIEWS OF THE DRAWINGS

In FIG. 27 is shown various cross-sections of light pipes for use with an embodiment of the invention;

In FIG. 28 is shown various configurations of waveguides for use with an embodiment of the invention;

DETAILED DESCRIPTION OF THE PREFERRED EMBODIMENTS

Figure 1:
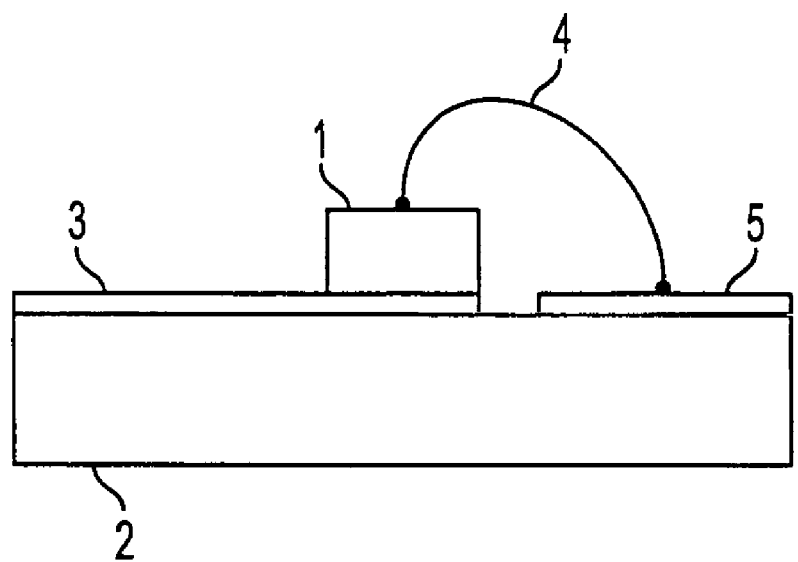
In FIG. 1 is shown a schematic diagram of a LED chip mounted on a substrate for use with an embodiment of the invention.
Figure 2:
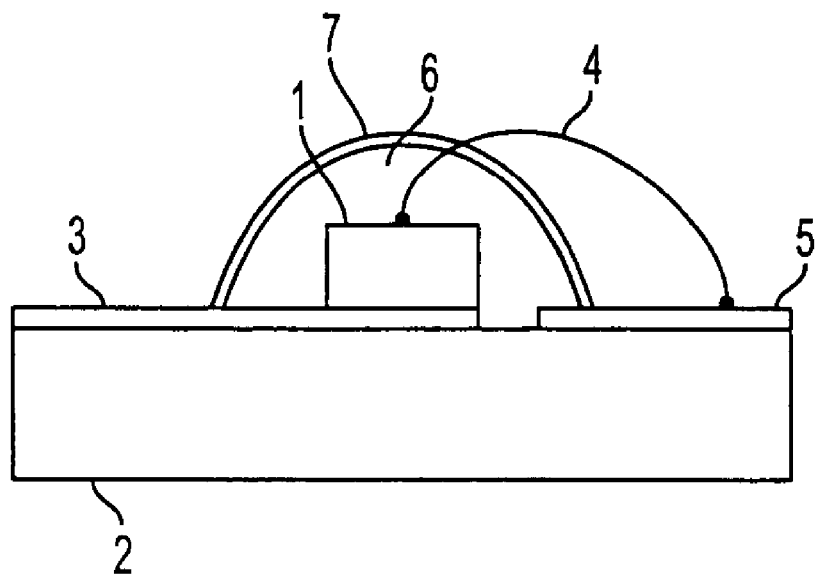
In FIG. 2 is shown a schematic diagram of a white LED, with the chip mounted on a substrate and covered with transparent epoxy and a layer of phosphor for use with an embodiment of the invention.
Figure 3:
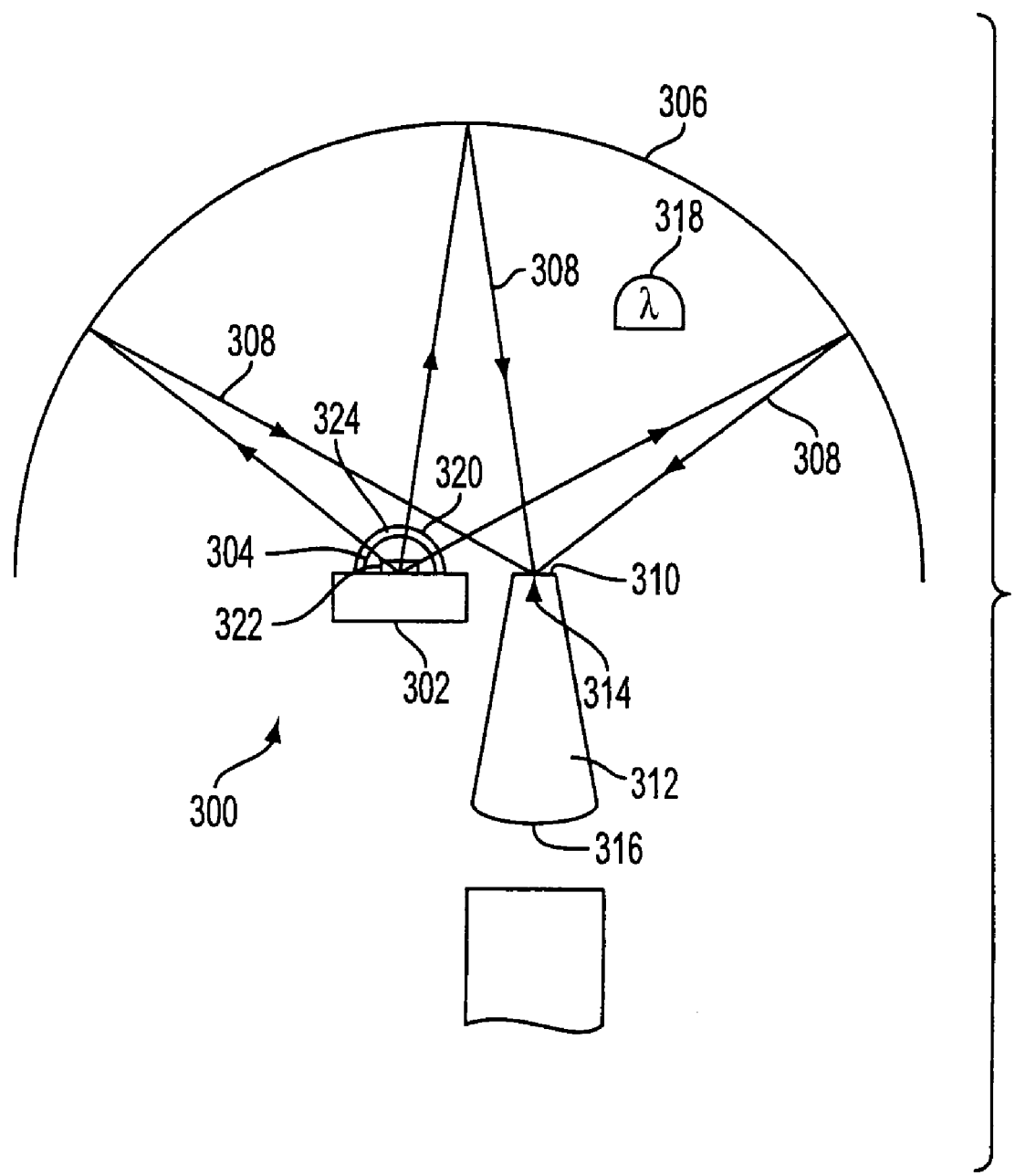
In FIG. 3 is shown an illumination engine according to a first embodiment of the invention.

In FIG. 3 is shown an illumination engine 300 according to a first embodiment of the invention. A first source of electro-luminescence 302 is disposed proximate to a first focal point 304 of a first reflector 306 to emit rays of radiation 308 in a first range of wavelengths 318 that reflect from first reflector 306 and converge substantially at a second focal point 310 of first reflector 306. A first light pipe 312 having an first input end 314 located proximate to second focal point 310 to collect substantially all of radiation 308, and a first output end 316 through which substantially all of radiation 308 is transmitted.

First source of electro-luminescence 302 may be, e.g. source of injection electro-luminescence, such as a forward-biased p-n junction, or a light-emitting diode. Radiation 308 may be, e.g. recombination radiation. First output end 316 may be, e.g. substantially convex. First range of wavelengths 318 may be, e.g. white radiation, infrared radiation, red radiation, orange radiation, yellow radiation, green radiation, blue radiation, indigo radiation, violet radiation, and ultraviolet radiation. The LED may be placed at a first focus of the reflector while a target is placed at a second focus of the reflector. The target may be, e.g. a tapered light pipe (TLP). A reflector may provide a magnification of 1:1 such that the etendue of the LED emission is preserved at the input of the output TLP.

In one embodiment, first source of electro-luminescence 302 includes a conversion layer 320, which may be made of, e.g. phosphor, converts radiation 308 to produce substantially white radiation. Conversion layer 320 may be, e.g. a first layer of substantially clear epoxy 322 and a second layer of substantially white phosphor 324, or a single layer of white phosphor. In another embodiment, the electro-luminescence 302 does not have a phosphor conversion layer 320 or clear epoxy 322.

Figure 26A:
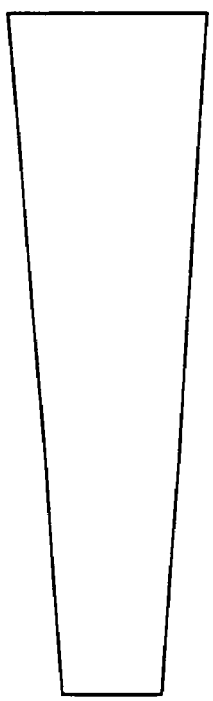
In FIG. 26 is shown a straight and a tapered homogenizer for use with an embodiment of the invention.
Figure 26B:
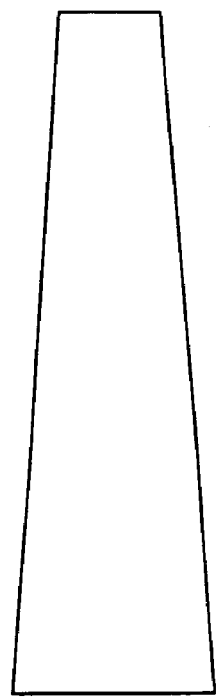
Figure 26C:
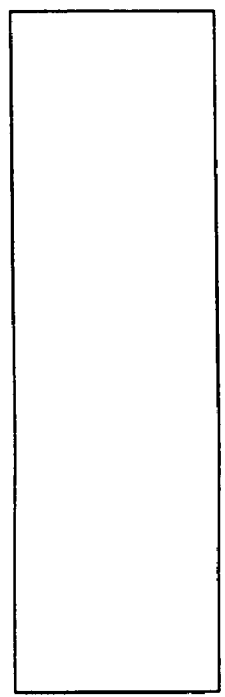
Figure 29B:
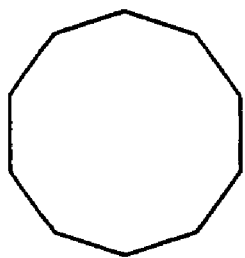
In FIG. 29 is shown various cross-sections of waveguides for use with an embodiment of the invention.
Figure 29D:
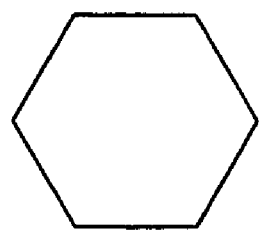
Figure 29A:
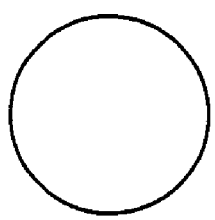
Figure 29C:
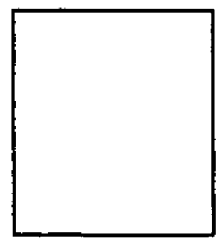
Figure 30B:
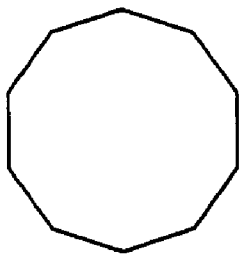
In FIG. 30 is shown various cross-sections of homogenizers for use with an embodiment of the invention; and In FIG. 31 is shown an illumination system according to the seventh or eighth embodiment of the invention.
Figure 30D:
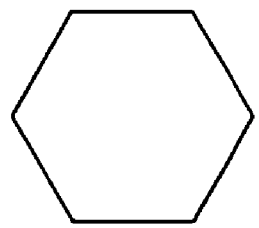
Figure 30A:
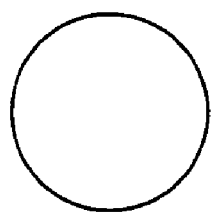
Figure 30C:
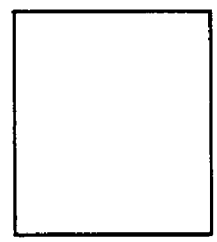

First light pipe 312 may be, e.g. a tapered light pipe or a straight light pipe, as shown in FIG. 26. A cross-section of first light pipe 312 may be, e.g. a rectangle, a circle, a triangle, a rhombus, a trapezoid, a pentagon, a hexagon, or an octagon, as shown in FIG. 27.

First reflector 306 may be, e.g. at least a portion of a substantially ellipsoidal surface of revolution, at least a portion of a substantially toroidal surface of revolution, at least a portion of a substantially spheroidal surface of revolution, or at least a portion of a substantially dual-paraboloidal surface of revolution.

For the case of the toroidal and spherical surface of revolutions, one focal point may be defined as a first point chosen close to a center of curvature and a second point having the best image of the first point. The two points may be, e.g. substantially equidistant from the center of curvature and on opposite sides of the center of curvature. For the case of the dual paraboloidal surface of revolution, the two focal points correspond to a focal point of each paraboloidal surface of revolution.

In one embodiment, first reflector 306 has a coating that reflects only a pre-specified portion of the electromagnetic radiation spectrum, such as, e.g. visible light radiation, a pre-specified band of radiation, or a specific color of radiation.

Figure 4:
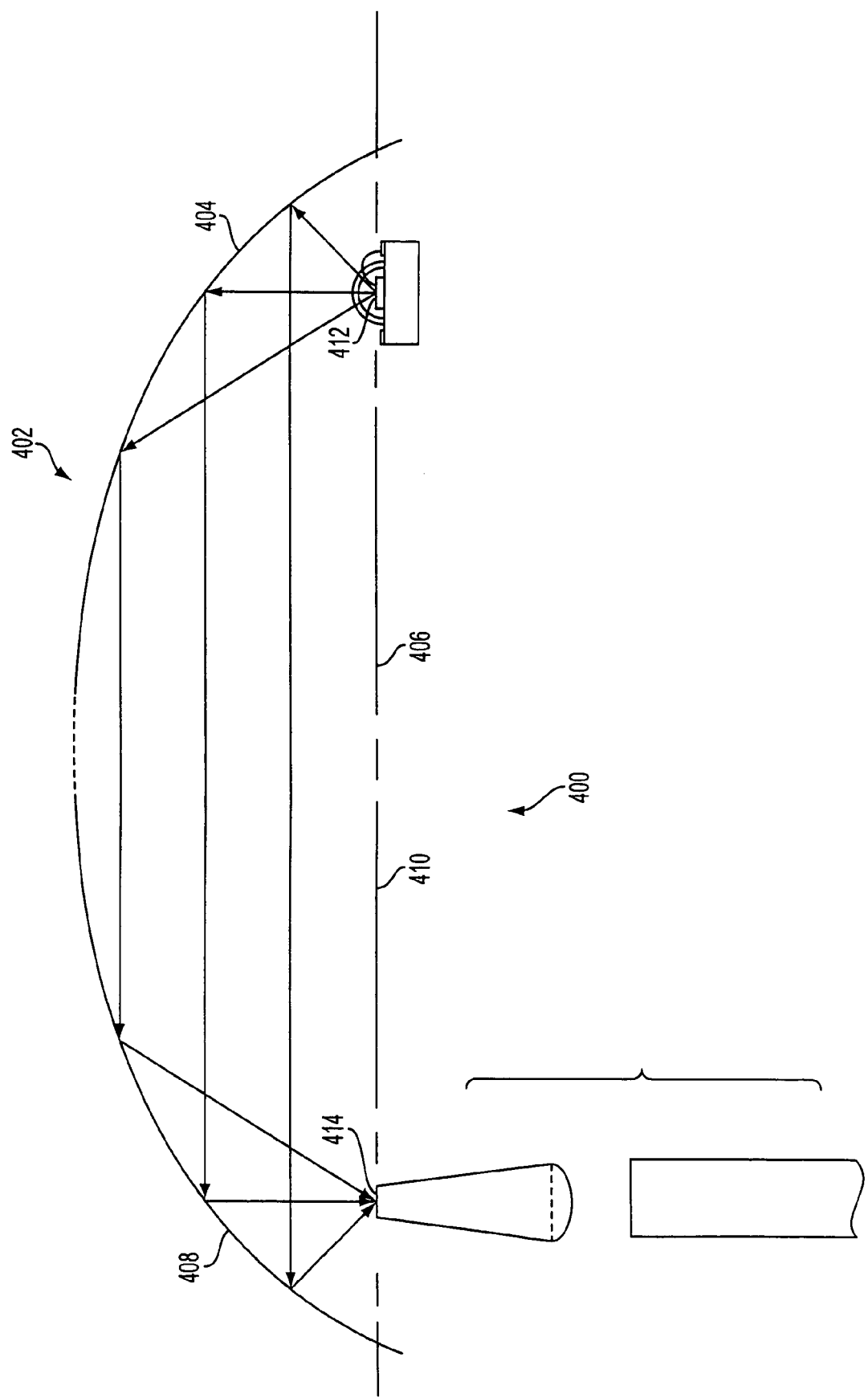
In FIG. 4 is shown an illumination engine according to a second embodiment of the invention.

In FIG. 4 is shown an illumination engine 400 according to a second embodiment of the invention. In the second embodiment, first reflector 402 is composed of a first primary reflector 404 having a first optical axis 406 and a first focal point 412, and a first secondary reflector 408 having a second optical axis 410 and a second focal point 414. First secondary reflector 408 may be placed substantially symmetrically to first primary reflector 404 such that first and second optical axes 406, 410 are substantially collinear.

First primary and first secondary reflectors 404, 408 may be, e.g. at least a portion of a substantially paraboloidal surface of revolution. In one embodiment, first primary reflector 404 comprises at least a portion of a substantially ellipsoidal surface of revolution, and first secondary reflector 408 comprises at least a portion of a substantially hyperboloidal surface of revolution. In another embodiment, first primary reflector 404 comprises at least a portion of a substantially hyperboloidal surface of revolution, and first secondary reflector 408 comprises at least a portion of a substantially ellipsoidal surface of revolution.

Figure 5:
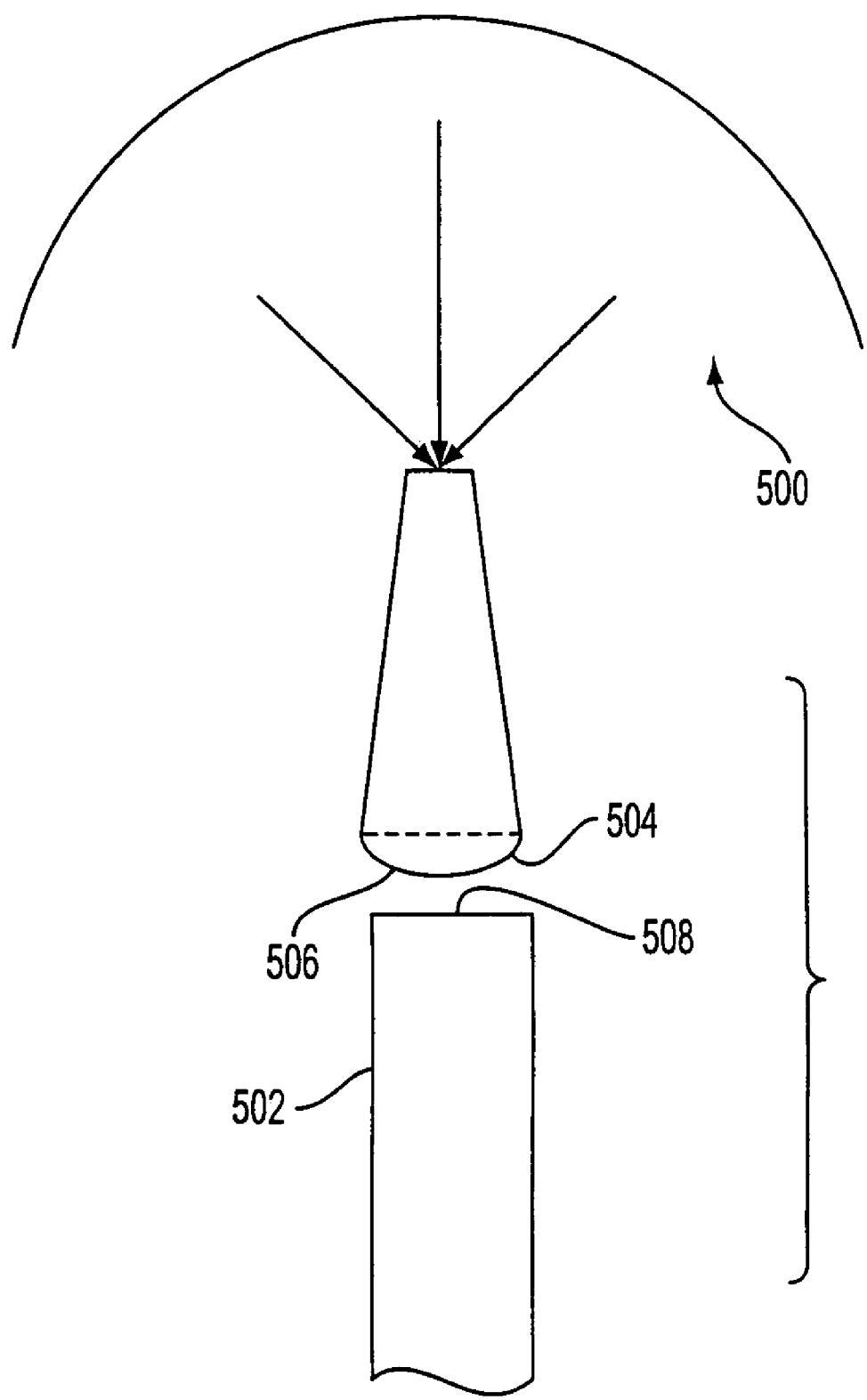
In FIG. 5 is shown a waveguide for use with the first or the second embodiment of the invention.

In FIG. 5 is shown an illumination engine 500 according to the first or the second embodiment of the invention with a waveguide 502 disposed substantially proximate to output end 504. Waveguide 502 may be, e.g. a single core optic fiber, a fiber bundle, a fused fiber bundle, a polygonal rod, or a hollow reflective light pipe, as shown in FIG. 28.

In one embodiment, a first etendue 506 is associated with output end 504, while a second etendue 508 is associated with waveguide 502, such that first etendue 506 is substantially equal to second etendue 508. A cross-section of waveguide 502 may be, e.g. a circle, or a polygon, as shown in FIG. 29. In another embodiment, waveguide 502 may be a tapered waveguide. Waveguide 502 may be made of, eg quartz, glass, plastic, or acrylic.

Figure 6:
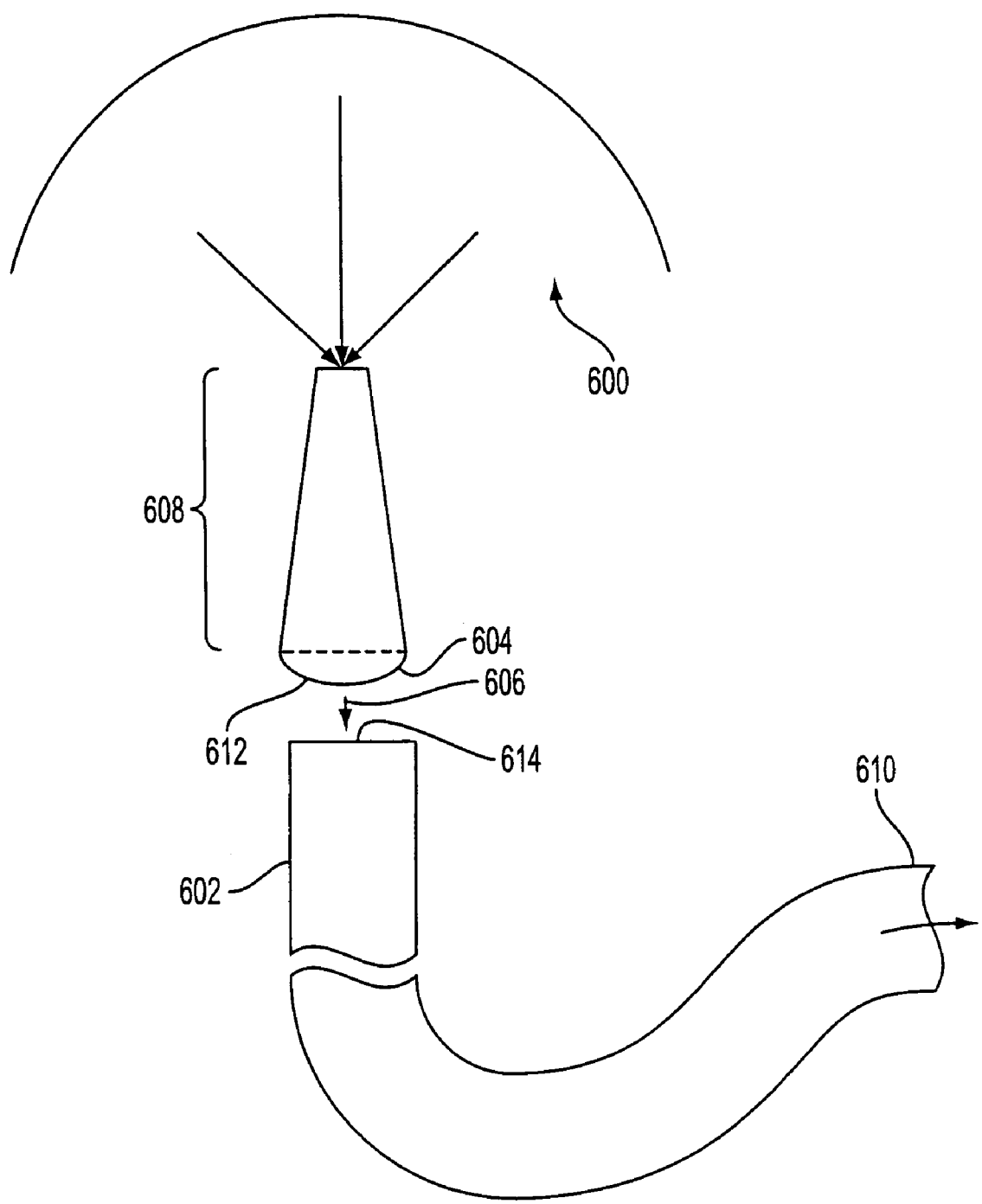
In FIG. 6 is shown a fiber optic for use with the first or the second embodiment of the invention.

In FIG. 6 is shown an illumination engine 600 according to the first or the second embodiment of the invention with a fiber optic 602 disposed substantially proximate to output end 604. Fiber optic 602 may be illuminated by radiation 606 transmitted at output end 604 of first light pipe 608, the fiber optic 602 releasing the collected and condensed radiation to provide for illumination at a desired location 610.

In one embodiment, a first etendue 612 is associated with output end 604, while a second etendue 614 is associated with fiber optic 602, such that first etendue 612 is substantially equal to second etendue 614.

Figure 7:
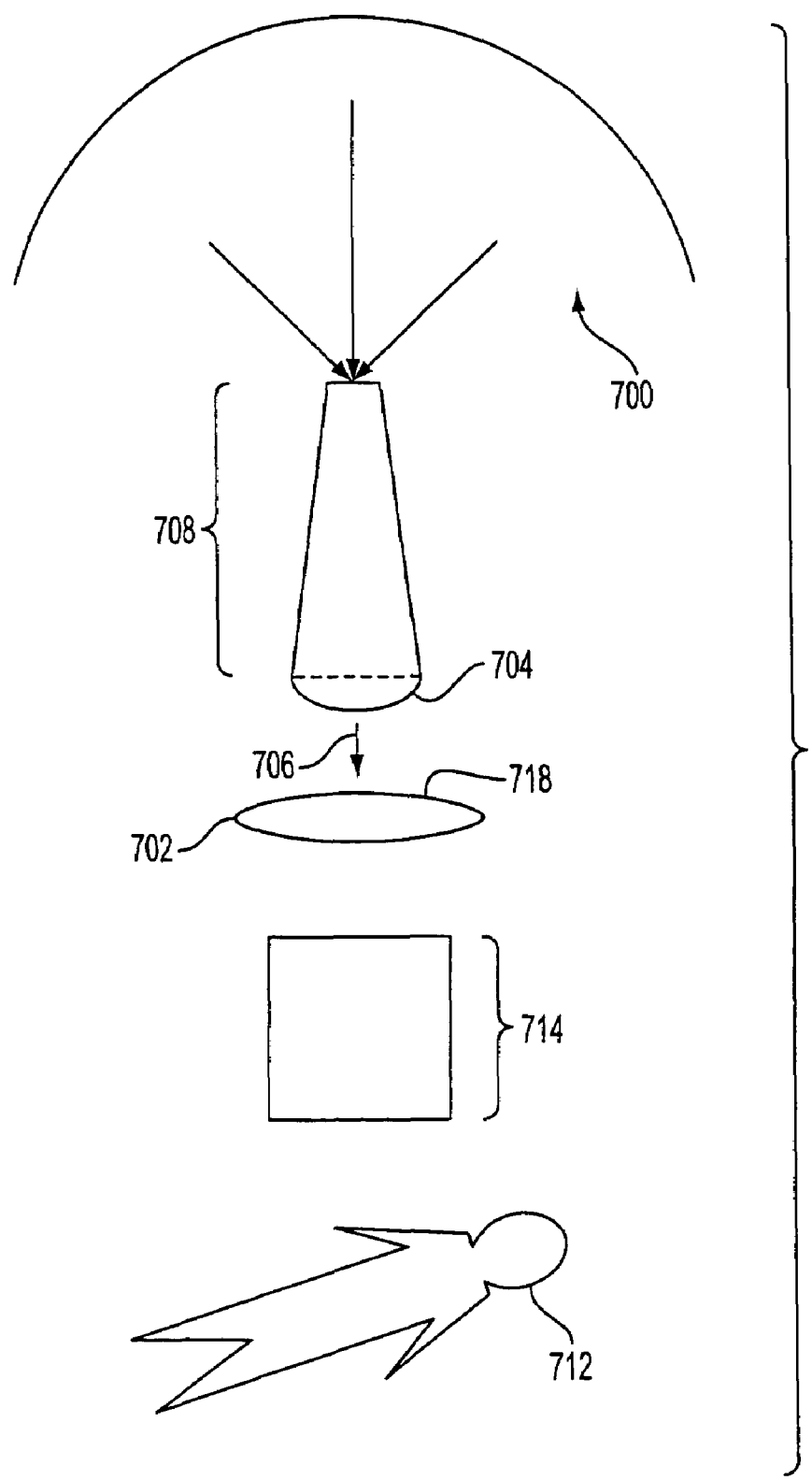
In FIG. 7 is shown a condenser lens and an image projection system for use with the first or the second embodiment of the invention.

In FIG. 7 is shown an illumination engine 700 according to the first or the second embodiment of the invention with a condenser lens 702 disposed substantially proximate to output end 704 and an image projection system 714 disposed substantially proximate to an output side of condenser lens 702. Projection system 714 may display an image 712 being illuminated by the radiation 706 transmitted at output end 704 of first light pipe 708.

In one embodiment, a first etendue 716 is associated with output end 704, while a second etendue 718 is associated with condenser lens 702, such that first etendue 716 is substantially equal to second etendue 718.

Figure 8:
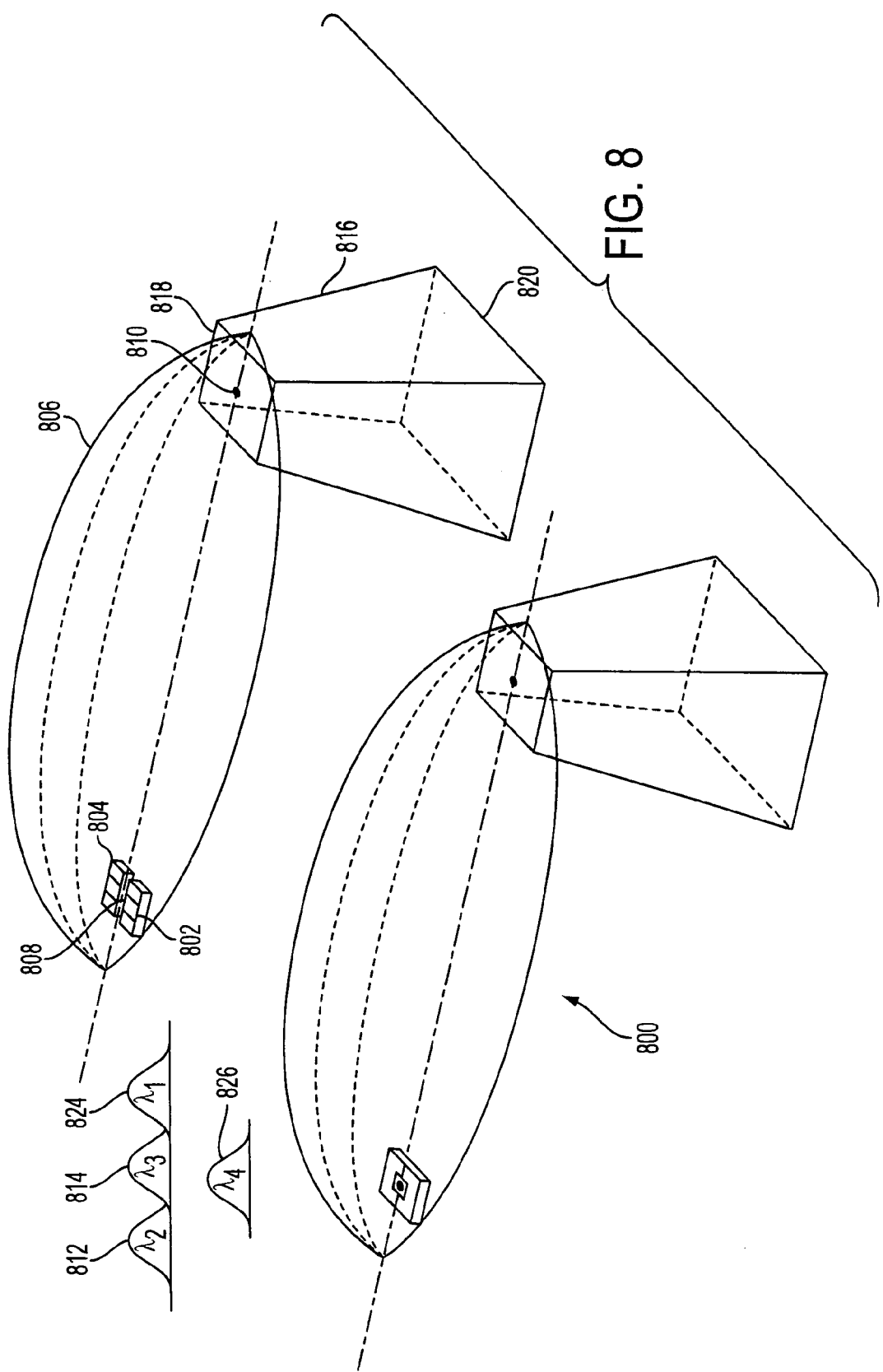
In FIG. 8 is shown an illumination engine according to a third embodiment of the invention.

In FIG. 8 is shown an illumination engine 800 according to a third embodiment of the invention. In the third embodiment, a second and third sources of electro-luminescence 802, 804 are added to the first embodiment. A second reflector 806 having a third and fourth focal points 808, 810 is arranged so that second and third sources of electro-luminescence 802, 804 are located proximate to third focal point 808 to emit rays of radiation in a second and third ranges of wavelengths 812, 814 that reflect from second reflector 806 and substantially converge at fourth focal point 810.

A second light pipe 816 having a second input and output ends 818, 820 is arranged such that second input end 818 is located proximate to fourth focal point 810 to collect substantially all of radiation of second and third ranges of wavelengths 812, 814. First and second output ends 820, 822 transmit substantially all of radiation of first, second and third ranges of wavelengths 824, 812, 814. In one embodiment, second output end 820 is substantially convex. In one embodiment, first, second and third ranges 824, 812, 814 are substantially incongruent. In another embodiment, first, second and third ranges 824, 812, 814 are combined to produce a fourth range of wavelengths 826.

In another embodiment, second and third sources of electro-luminescence 802, 804 emit radiation substantially sequentially. Second and third sources of electro-luminescence 802, 804 may be, e.g. sources of injection electroluminescence, such as forward-biased p-n junctions, or light-emitting diodes. In one embodiment, second and third ranges 812, 814 comprise recombination radiation. Second range of wavelengths 812 may be, e.g. white radiation, infrared radiation, red radiation, orange radiation, yellow radiation, green radiation, blue radiation, indigo radiation, violet radiation, and ultraviolet radiation. Third range of wavelengths 814 may be, e.g. white radiation, infrared radiation, red radiation, orange radiation, yellow radiation, green radiation, blue radiation, indigo radiation, violet radiation, and ultraviolet radiation.

Second light pipe 816 may be, e.g. a tapered light pipe or a straight light pipe, as shown in FIG. 26. A cross-section of second light pipe 816 may be, e.g. a rectangle, a circle, a triangle, a rhombus, a trapezoid, a pentagon, a hexagon, or an octagon, as shown in FIG. 27. Second reflector 806 may be, e.g. at least a portion of a substantially ellipsoidal surface of revolution, at least a portion of a substantially toroidal surface of revolution, at least a portion of a substantially spheroidal surface of revolution, or at least a portion of a substantially dual paraboloidal surface of revolution. In one embodiment, second reflector 806 has a coating that reflects only a pre-specified portion of the electromagnetic radiation spectrum, such as, e.g. visible light radiation, a pre-specified band of radiation, or a specific color of radiation.

Figure 9:
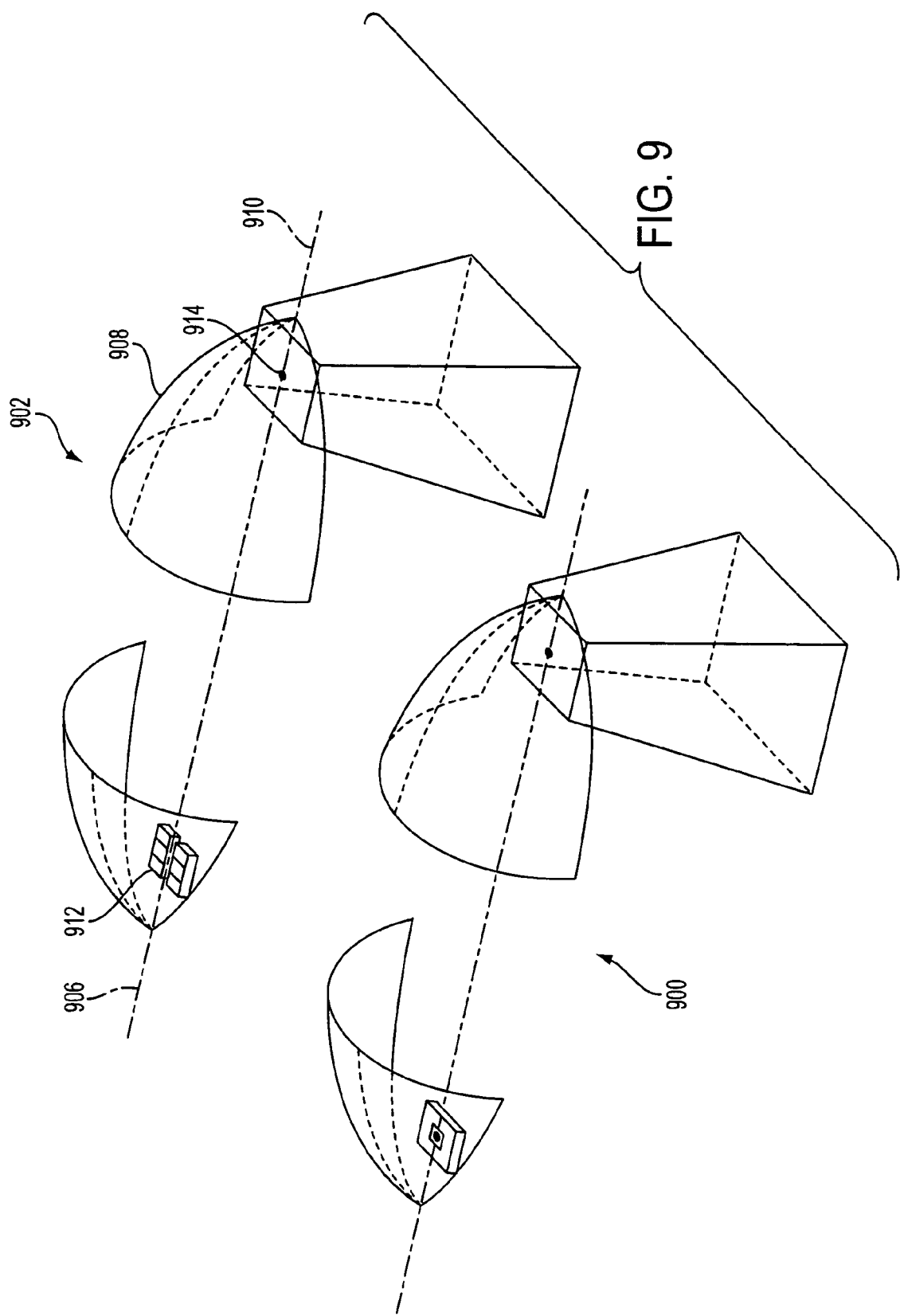
In FIG. 9 is shown an illumination engine according to a fourth embodiment of the invention.

In FIG. 9 is shown an illumination engine 900 according to a fourth embodiment of the invention. In the fourth embodiment, second reflector 902 is composed of a second primary reflector 904 having a first optical axis 906 and a third focal point 912, and a second secondary reflector 908 having a second optical axis 910 and a fourth focal point 914. Second secondary reflector 908 may be placed substantially symmetrically to second primary reflector 904 such that first and second optical axes 906, 910 are substantially collinear.

Second primary and second secondary reflectors 904, 908 may be, e.g. at least a portion of a substantially paraboloidal surface of revolution. In one embodiment, second primary reflector 904 comprises at least a portion of a substantially ellipsoidal surface of revolution, and second secondary reflector 908 comprises at least a portion of a substantially hyperboloidal surface of revolution. In another embodiment, second primary reflector 904 comprises at least a portion of a substantially hyperboloidal surface of revolution, and second secondary reflector 908 comprises at least a portion of a substantially ellipsoidal surface of revolution.

Figure 10:
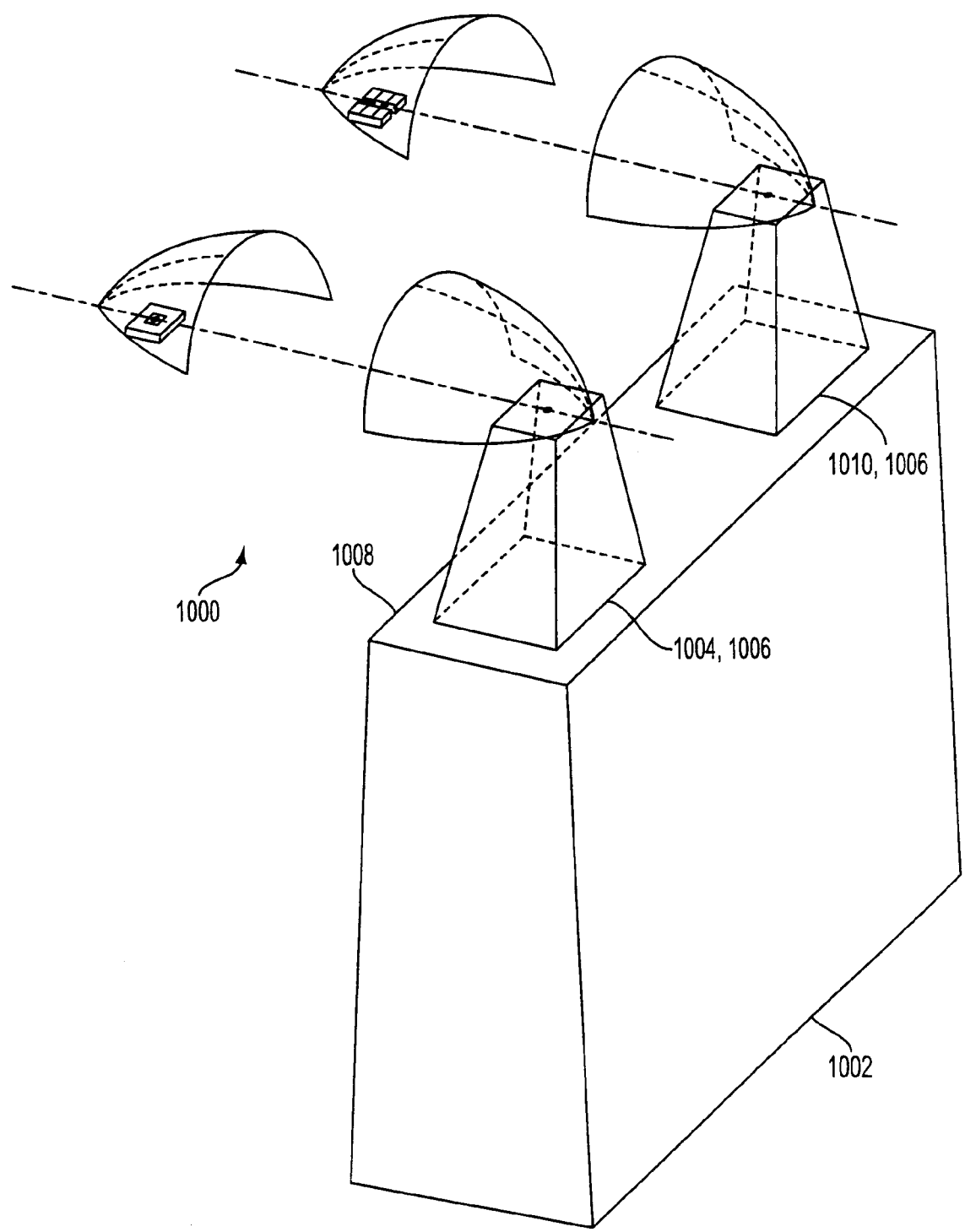
In FIG. 10 is shown an homogenizer for use with the third or the fourth embodiment of the invention.

In FIG. 10 is shown an illumination engine 1000 according to the third or the fourth embodiment of the invention with a homogenizer 1002 disposed substantially proximate to first and second output ends 1004 and 1010.

In one embodiment, a first etendue 1006 is associated with first and second output ends 1004 and 1010, while a second etendue 1008 is associated with homogenizer 1002, such that first etendue 1006 is substantially equal to second etendue 1008. A cross-section of homogenizer 1002 may be, e.g. a circle, or a polygon, as shown in FIG. 30. In another embodiment, homogenizer 1002 may be a tapered waveguide. Homogenizer 1002 may be made of, e.g. quartz, glass, plastic, or acrylic.

Figure 11:
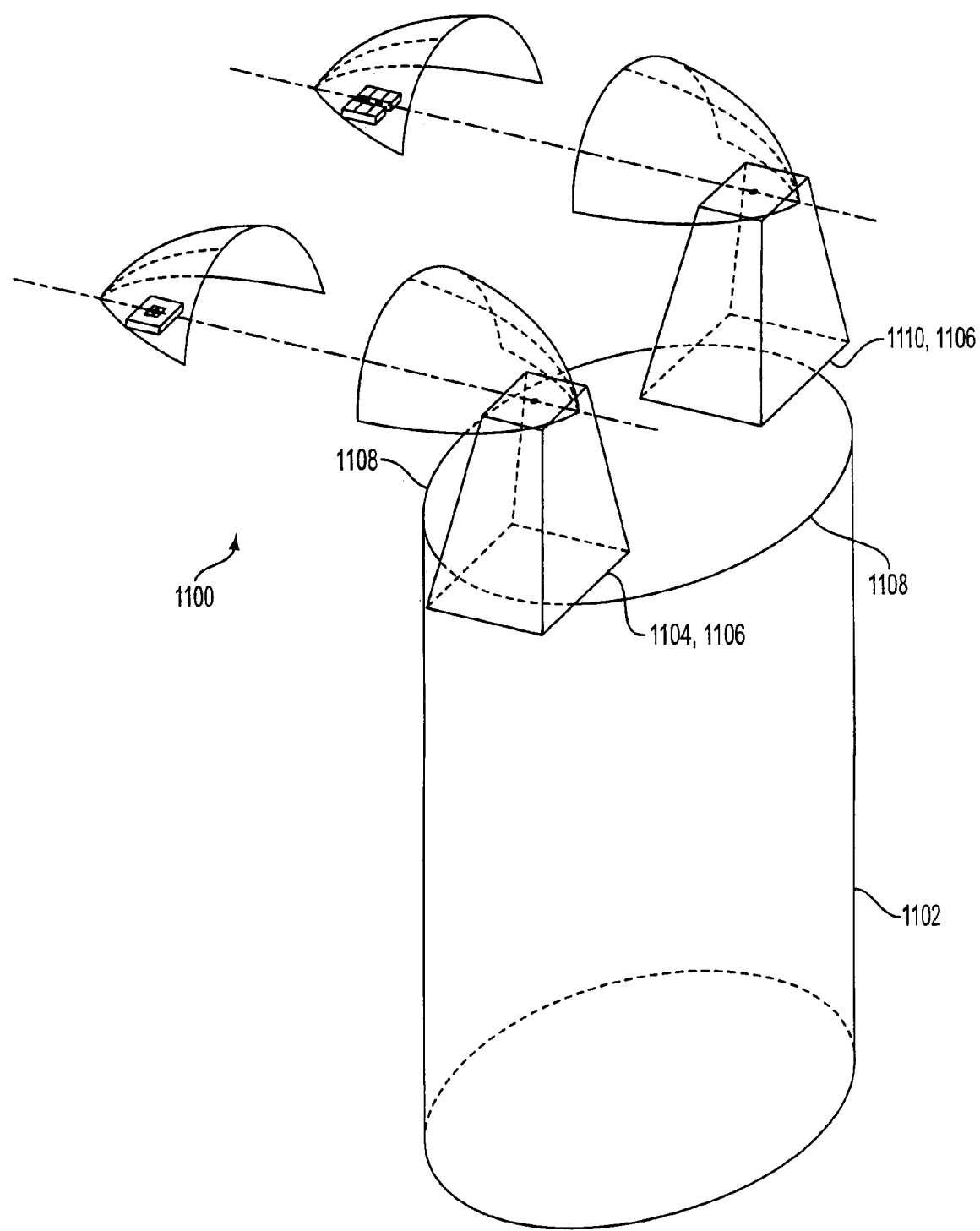
In FIG. 11 is shown a waveguide for use with the third or the fourth embodiment of the invention.

In FIG. 11 is shown an illumination engine 1100 according to the third or the fourth embodiment of the invention with a waveguide 1102 disposed substantially proximate to first and second output ends 1104 and 1110. Waveguide 1102 may be, e.g. a single core optic fiber, a fiber bundle, a fused fiber bundle, a polygonal rod, or a hollow reflective light pipe, as shown in FIG. 28.

In one embodiment, a first etendue 1106 is associated with first and second output ends 1104 and 1110, while a second etendue 1108 is associated with waveguide 1102, such that first etendue 1106 is substantially equal to second etendue 1108. A cross-section of waveguide 1102 may be, e.g. a circle, or a polygon, as shown in FIG. 29. In another embodiment, waveguide 1102 may be a tapered waveguide. Waveguide 1102 may be made of, e.g. quartz, glass, plastic, or acrylic.

Figure 12:
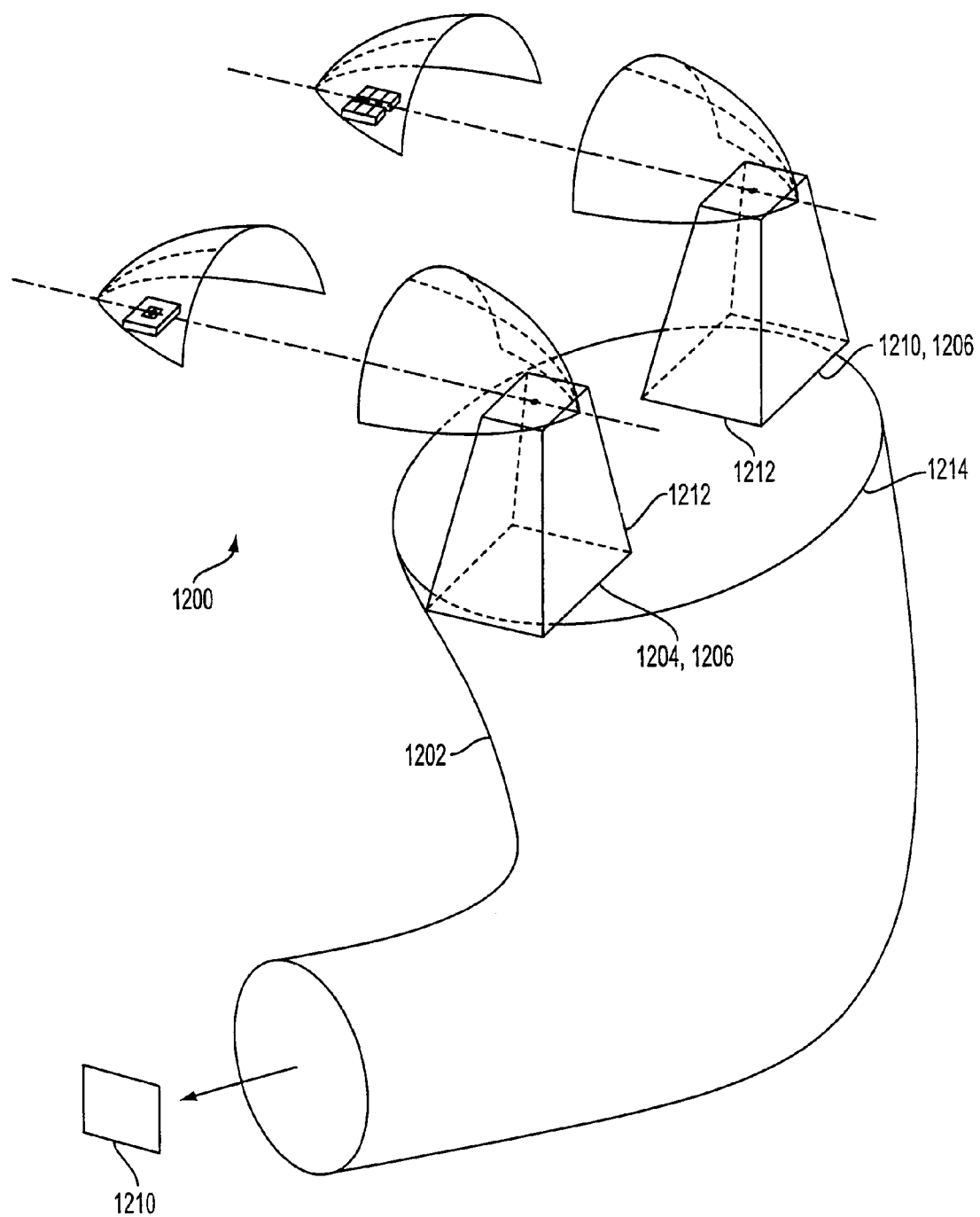
In FIG. 12 is shown a fiber optic for use with the third or the fourth embodiment of the invention.

In FIG. 12 is shown an illumination engine 1200 according to the third or the fourth embodiment of the invention with a fiber optic 1202 disposed substantially proximate to first and second output ends 1204 and 1210. Fiber optic 1202 may be illuminated by radiation 1206 transmitted at first and second output ends 1204 and 1210, the fiber optic 1202 releasing the collected and condensed radiation to provide for illumination at a desired location 1210.

In one embodiment, a first etendue 1212 is associated with first and second output ends 1204 and 1210, while a second etendue 1214 is associated with fiber optic 1202, such that first etendue 1212 is substantially equal to second etendue 1214.

Figure 13:
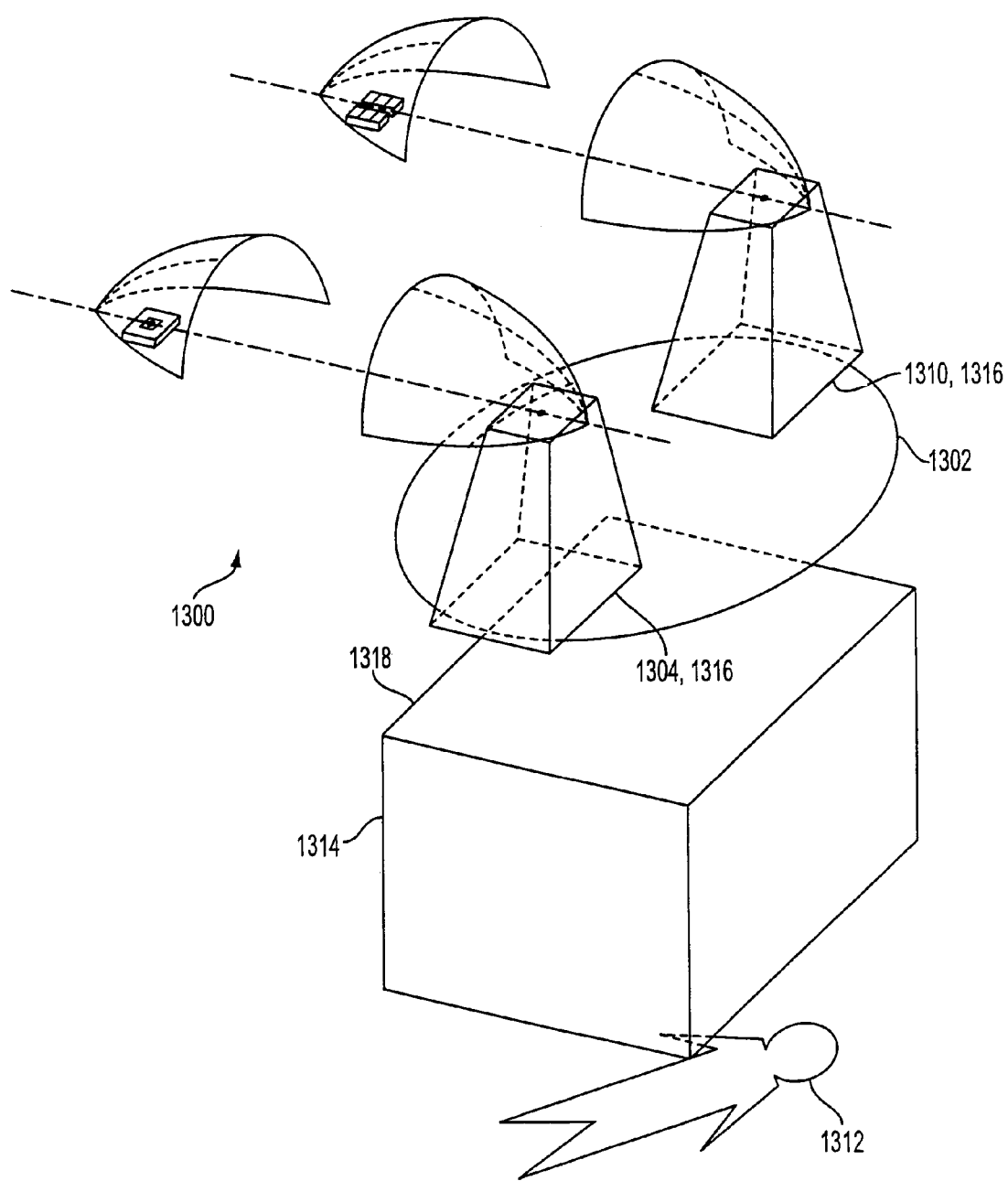
In FIG. 13 is shown a condenser lens and an image projection system for use with the third or the fourth embodiment of the invention.

In FIG. 13 is shown an illumination engine 1300 according to the third or the fourth embodiment of the invention with a condenser lens 1302 disposed substantially proximate to first and second output ends 1304 and 1310 and an image projection system 1314 disposed substantially proximate to an output side of condenser lens 1302. Projection system 1314 may display an image 1312 being illuminated by the radiation 1306 transmitted at first and second output ends 1304 and 1310.

In one embodiment, a first etendue 1316 is associated With first and second output ends 1304 and 1310, while a second etendue 1318 is associated with condenser lens 1302, such that first etendue 1316 is substantially equal to second etendue 1318.

Figure 14:
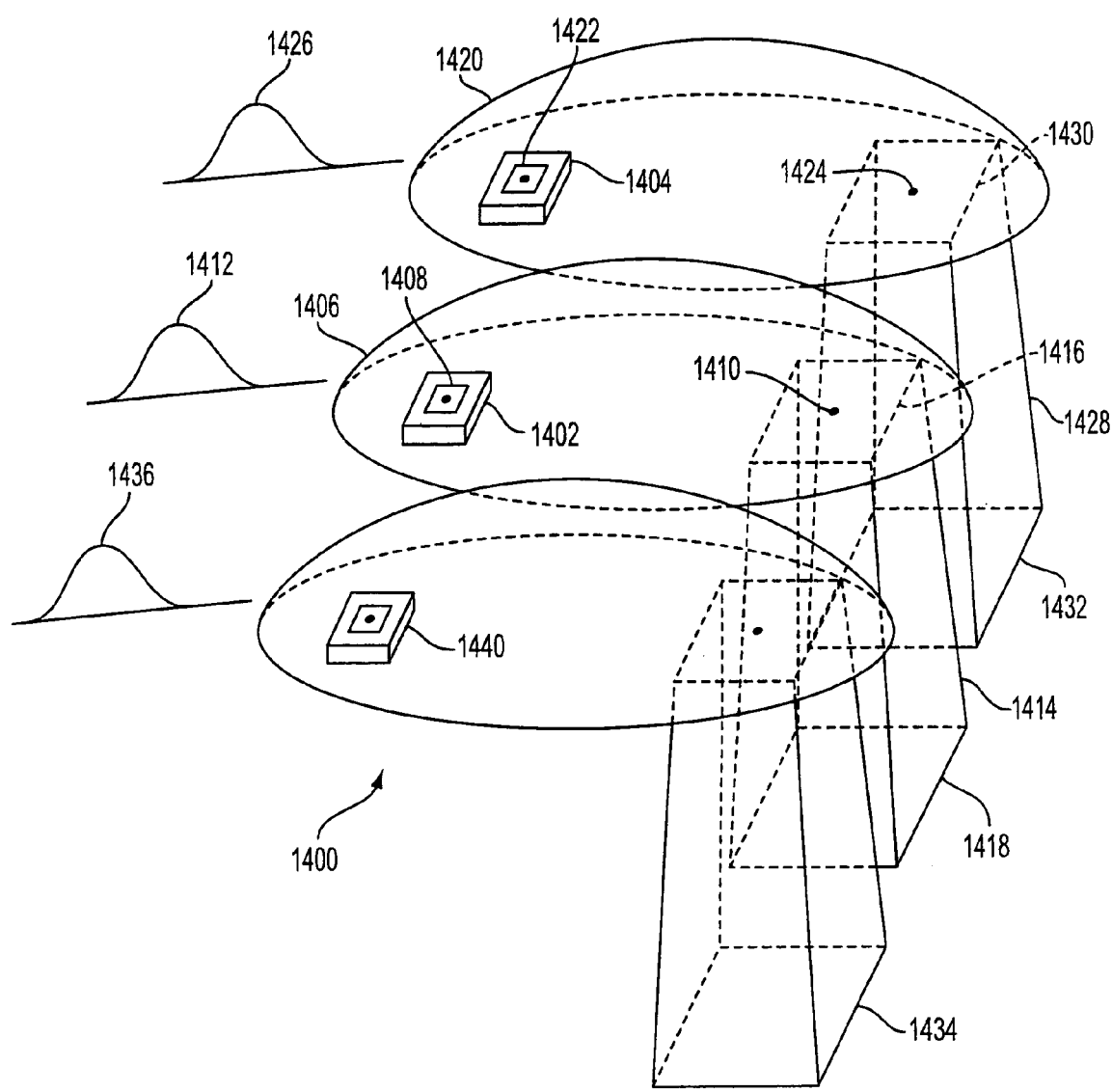
In FIG. 14 is shown an illumination engine according to a fifth embodiment of the invention.

In FIG. 14 is shown an array of reflectors according to a fifth embodiment of the invention. In the fifth embodiment, a second and third sources of electro-luminescence 1402, 1404 are added to the first embodiment. A second reflector 1406 having a third and fourth focal points 1408, 1410 is arranged so that second source of electro-luminescence 1402 is located proximate to third focal point 1408 to emit rays of radiation in a second range of wavelengths 1412 that reflect from second reflector 1406 and substantially converge at fourth focal point 1410. A second light pipe 1414 having a second input and output ends 1416, 1418 is arranged such that second input end 1416 is located proximate to fourth focal point 1410 to collect substantially all of radiation of second range of wavelengths 1412.

A third reflector 1420 having a fifth and sixth focal points 1422, 1424 is arranged so that third source of electro-luminescence 1404 is located proximate to fifth focal point 1422 to emit rays of radiation in a third range of wavelengths 1426 that reflect from third reflector 1420 and substantially converge at sixth focal point 1424. A third light pipe 1428 having a third input and output ends 1430, 1432 is arranged such that third input end 1430 is located proximate to fifth focal point 1422 to collect substantially all of radiation of third range of wavelengths 1426. First, second and third output ends 1434, 1418, 1432 transmit substantially all of radiation of first, second and third ranges of wavelengths 1436, 1412, 1426. In one embodiment, second and third output ends 1418, 1432 are substantially convex. In one embodiment, first, second and third ranges 1436, 1412, 1426 are substantially incongruent. In another embodiment, first, second and third ranges 1436, 1412, 1426 are combined to produce a fourth range of wavelengths 1438.

In another embodiment, first, second and third sources of electro-luminescence 1402, 1404, 1440 emit radiation substantially sequentially. First, second and third sources of electro-luminescence 1402, 1404, 1440 may be, e.g. sources of injection electro-luminescence, such as forward-biased p-n junctions, or light-emitting diodes. In one embodiment, first, second and third ranges 1436, 1412, 1426 comprise recombination radiation. Second range of wavelengths 1412 may be, e.g. white radiation, infrared radiation, red radiation, orange radiation, yellow radiation, green radiation, blue radiation, indigo radiation, violet radiation, and ultraviolet radiation. Third range of wavelengths 1426 may be, e.g. white radiation, infrared radiation, red radiation, orange radiation, yellow radiation, green radiation, blue radiation, indigo radiation, violet radiation, and ultraviolet radiation.

Second and third light pipes 1414, 1428 may be, e.g. a tapered light pipe or a straight light pipe, as shown in FIG. 26. A cross-section of second and third light pipes 1414, 1428 may be, e.g. a rectangle, a circle, a triangle, a rhombus, a trapezoid, a pentagon, a hexagon, or an octagon, as shown in FIG. 27.

Second and third reflectors 1406, 1420 may be, e.g. at least a portion of a substantially ellipsoidal surface of revolution, at least a portion of a substantially toroidal surface of revolution, at least a portion of a substantially spheroidal surface of revolution, or at least a portion of a substantially dual paraboloidal surface of revolution. In one embodiment, second and third reflectors 1406, 1420 have a coating that reflects only a pre-specified portion of the electromagnetic radiation spectrum, such as, eg visible light radiation, a pre-specified band of radiation, or a specific color of radiation.

Figure 15:
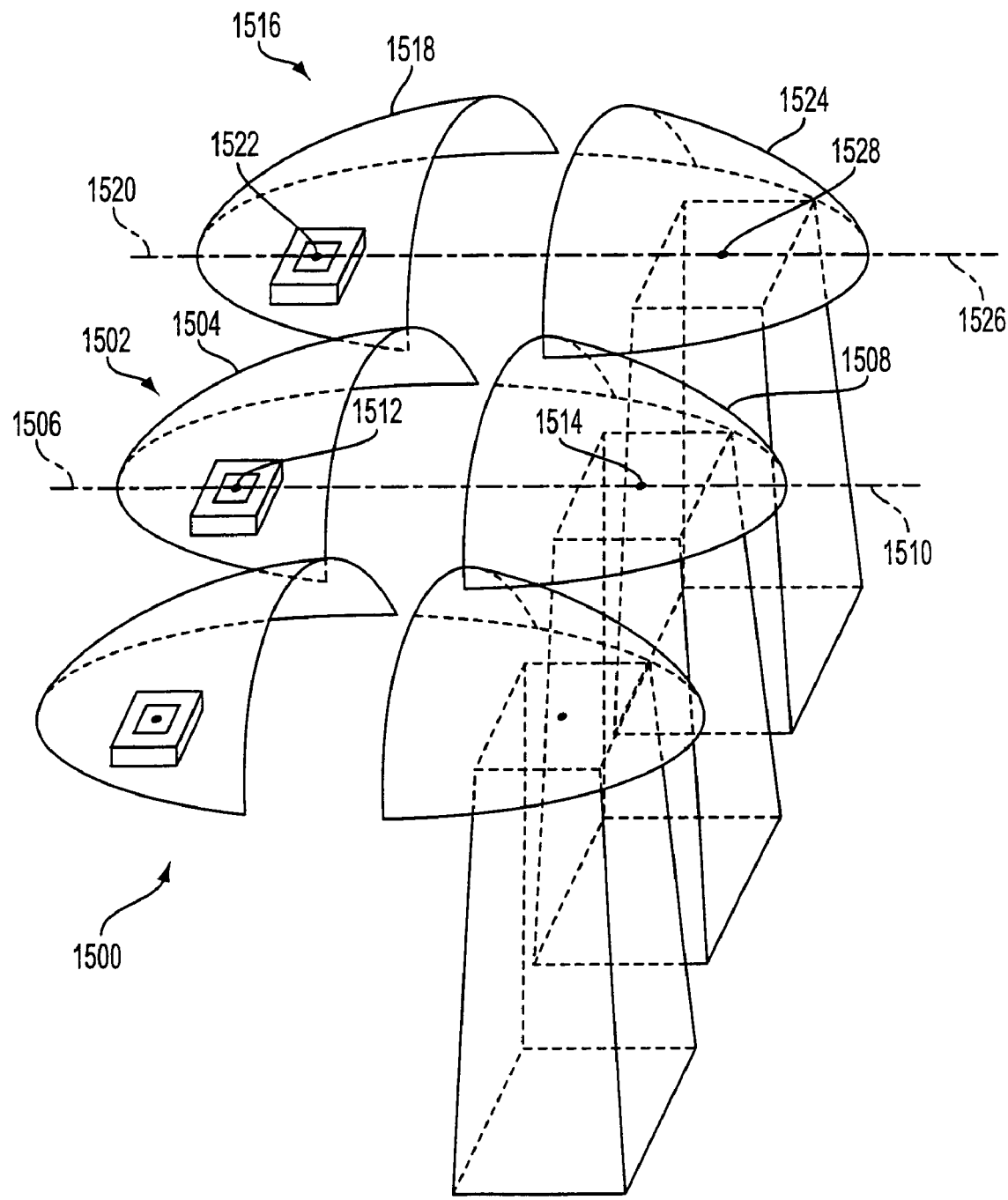
In FIG. 15 is shown an illumination engine according to a sixth embodiment of the invention.

In FIG. 15 is shown an illumination engine 1500 according to a sixth embodiment of the invention. In the sixth embodiment, second reflector 1502 is composed of a second primary reflector 1504 having a optical axis 1506 and a third focal point 1512, and a second secondary reflector 1508 having a second optical axis 1510 and a fourth focal point 1514. Second secondary reflector 1508 may be placed substantially symmetrically to second primary reflector 1504 such that first and second optical axes 1506, 1510 are substantially collinear.

Second primary and second secondary reflectors 1504, 1508 may be, eg at least a portion of a substantially paraboloidal surface of revolution. In one embodiment, second primary reflector 1504 comprises at least a portion of a substantially ellipsoidal surface of revolution, and second secondary reflector 1508 comprises at least a portion of a substantially hyperboloidal surface of revolution. In another embodiment, second primary reflector 1504 comprises at least a portion of a substantially hyperboloidal surface of revolution, and second secondary reflector 1508 comprises at least a portion of a substantially ellipsoidal surface of revolution.

Third reflector 1516 is composed of a third primary reflector 1518 having a first optical axis 1520 and a fifth focal point 1522, and a third secondary reflector 1524 having a second optical axis 1526 and a sixth focal point 1528. Third secondary reflector 1524 may be placed substantially symmetrically to third primary reflector 1518 such that first and second optical axes 1520, 1526 are substantially collinear.

Third primary and third secondary reflectors 1518, 1524 may be, e.g. at least a portion of a substantially paraboloidal surface of revolution. In one embodiment, third primary reflector 1518 comprises at least a portion of a substantially ellipsoidal surface of revolution, and third secondary reflector 1524 comprises at least a portion of a substantially hyperboloidal surface of revolution. In another embodiment, third primary reflector 1518 comprises at least a portion of a substantially hyperboloidal surface of revolution, and third secondary reflector 1524 comprises at least a portion of a substantially ellipsoidal surface of revolution.

Figure 16:
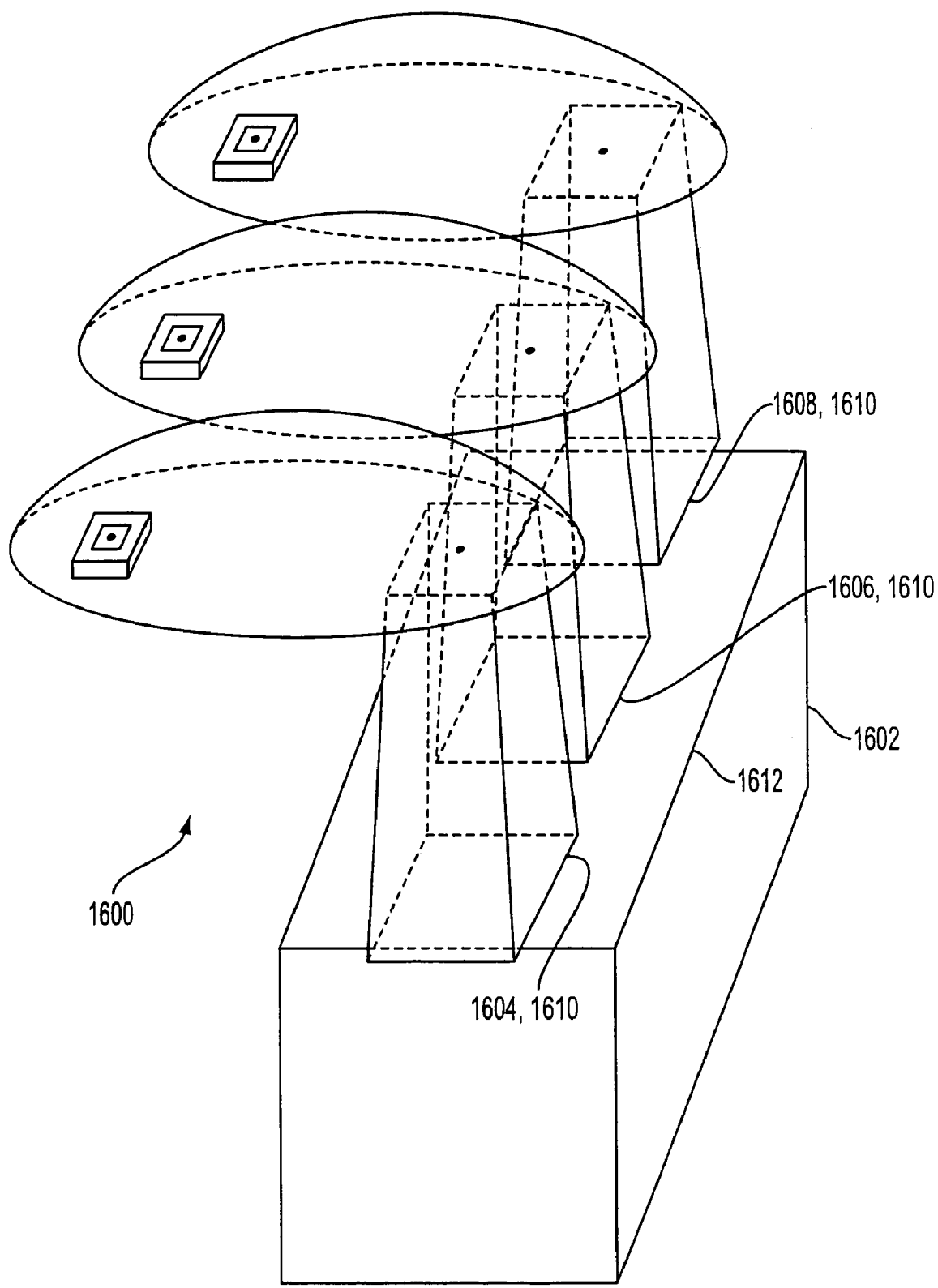
In FIG. 16 is shown an homogenizer for use with the fifth or the sixth embodiment of the invention.

In FIG. 16 is shown an illumination engine 1600 according to the fifth or the sixth embodiment of the invention with a homogenizer 1602 disposed substantially proximate to first, second and third output ends 1604, 1606 and 1608.

In one embodiment, a first etendue 1610 is associated with first, second and third output ends 1604, 1606 and 1608, while a second etendue 1612 is associated with homogenizer 1602, such that first etendue 1610 is substantially equal to second etendue 1612. A cross-section of homogenizer 1602 may be, e.g. a circle, or a polygon, as shown in FIG. 30. In another embodiment, homogenizer 1602 may be, e.g. a straight or a tapered homogenizer. Homogenizer 1602 may be made of, e.g. quartz, glass, plastic, or acrylic.

Figure 17:
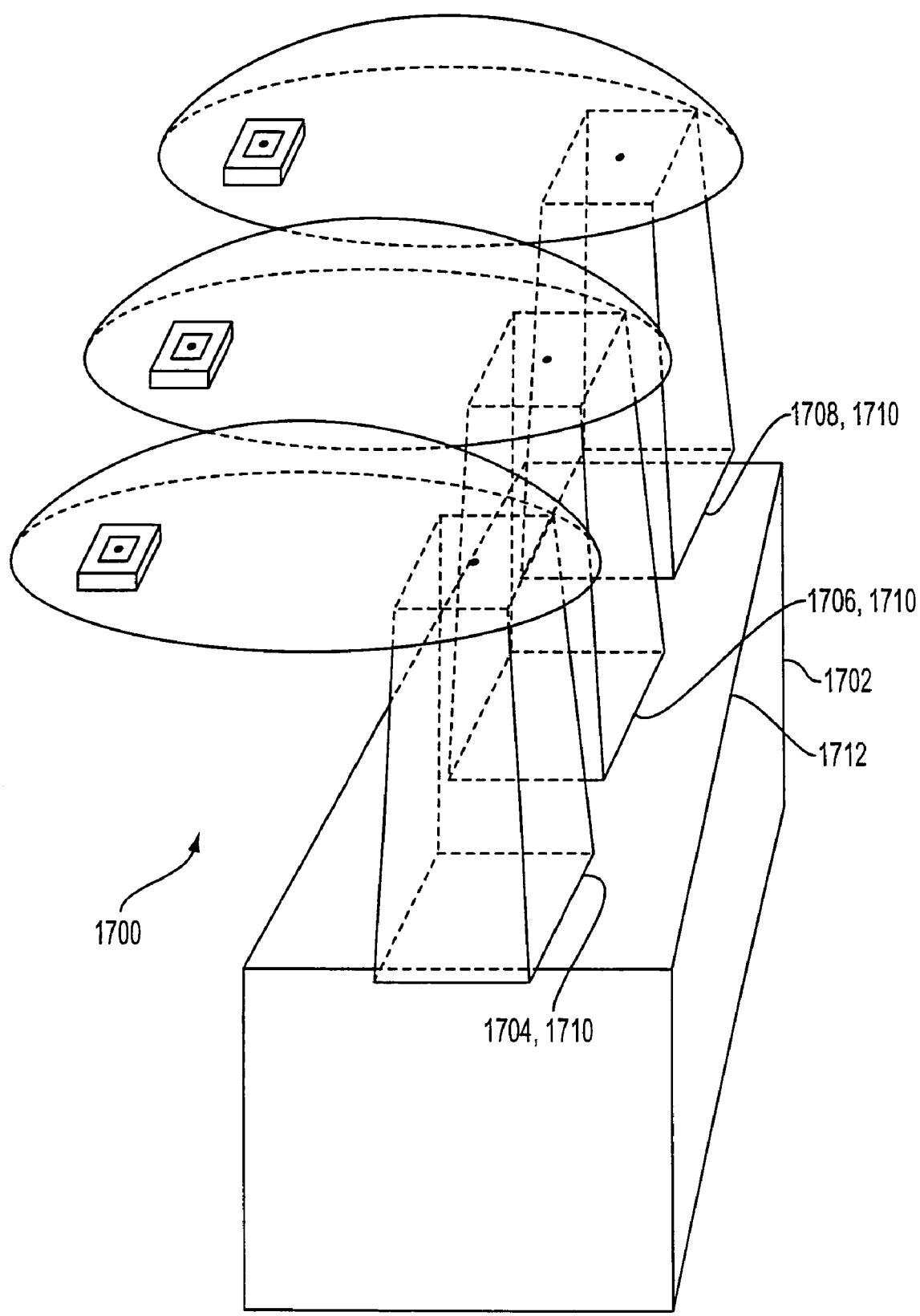
In FIG. 17 is shown a waveguide for use with the fifth or the sixth embodiment of the invention.

In FIG. 17 is shown an illumination engine 1700 according to the fifth or the sixth embodiment of the invention with a waveguide 1702 disposed substantially proximate to first, second and third output ends 1704, 1706 and 1708. Waveguide 1702 may be, e.g. a single core optic fiber, a fiber bundle, a fused fiber bundle, a polygonal rod, or a hollow reflective light pipe, as shown in FIG. 17.

In one embodiment, a first etendue 1710 is associated with first, second and third output ends 1704, 1706 and 1708, while a second etendue 1712 is associated with waveguide 1702, such that first etendue 1710 is substantially equal to second etendue 1712. A cross-section of waveguide 1702 may be, e.g. a circle, or a polygon, as shown in FIG. 29. In another embodiment, waveguide 1702 may be a tapered waveguide. Waveguide 1702 may be made of, e quartz, glass, plastic, or acrylic.

Figure 18:
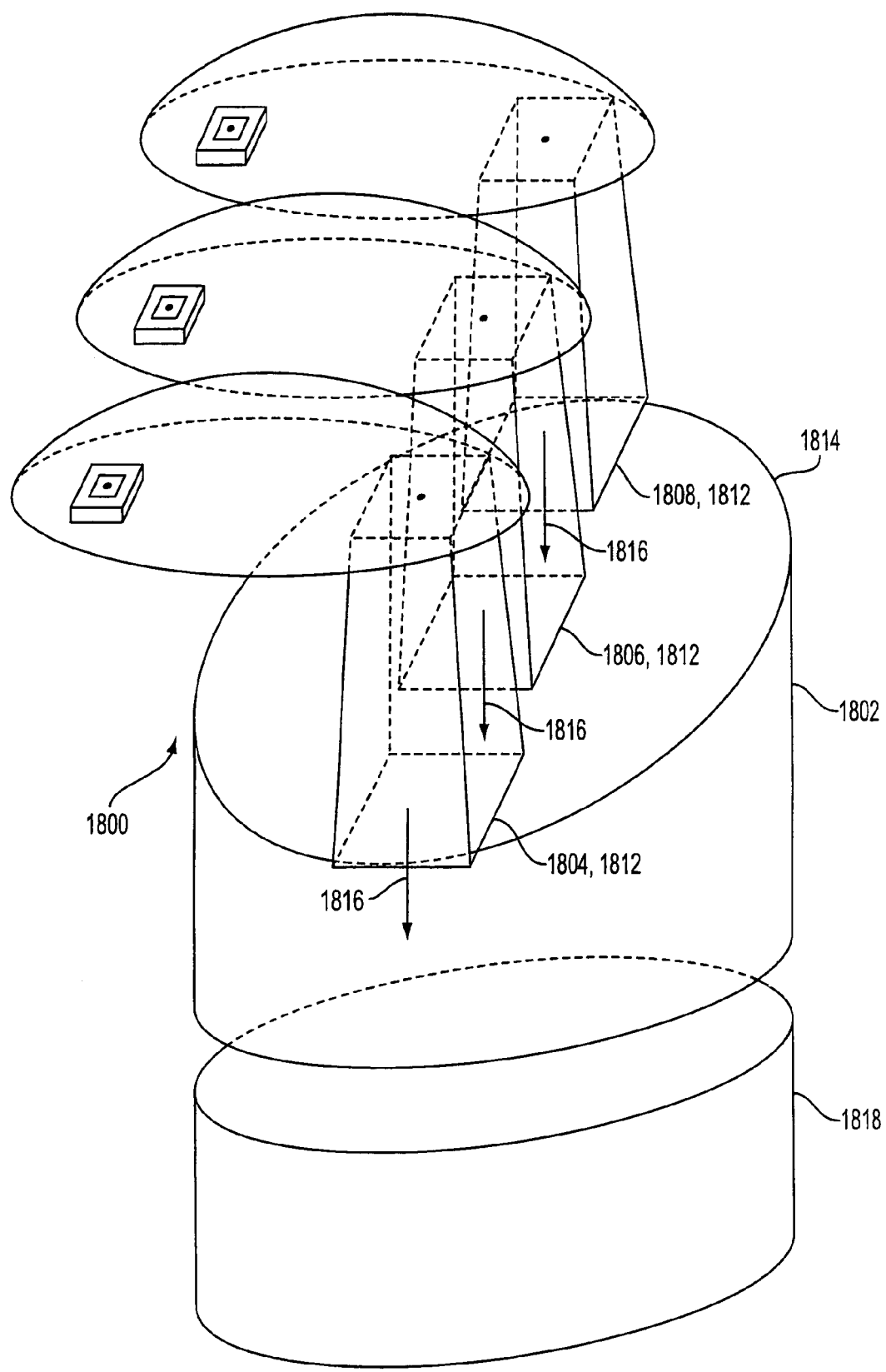
In FIG. 18 is shown a fiber optic for use with the fifth or the sixth embodiment of the invention.

In FIG. 18 is shown an illumination engine 1800 according to the fifth or the sixth embodiment of the invention with a fiber optic 1802 disposed substantially proximate to first, second and third output ends 1804, 1806 and 1808. Fiber optic 1802 may be illuminated by radiation 1816 transmitted at first, second and third output ends 1804, 1806 and 1808, the fiber optic 1802 releasing the collected and condensed radiation 1816 to provide for illumination at a desired location 1818.

In one embodiment, a first etendue 1812 is associated with first, second and third output ends 1804, 1806 and 1808, while a second etendue 1814 is associated with fiber optic 1802, such that first etendue 1812 is substantially equal to second etendue 1814.

Figure 19:
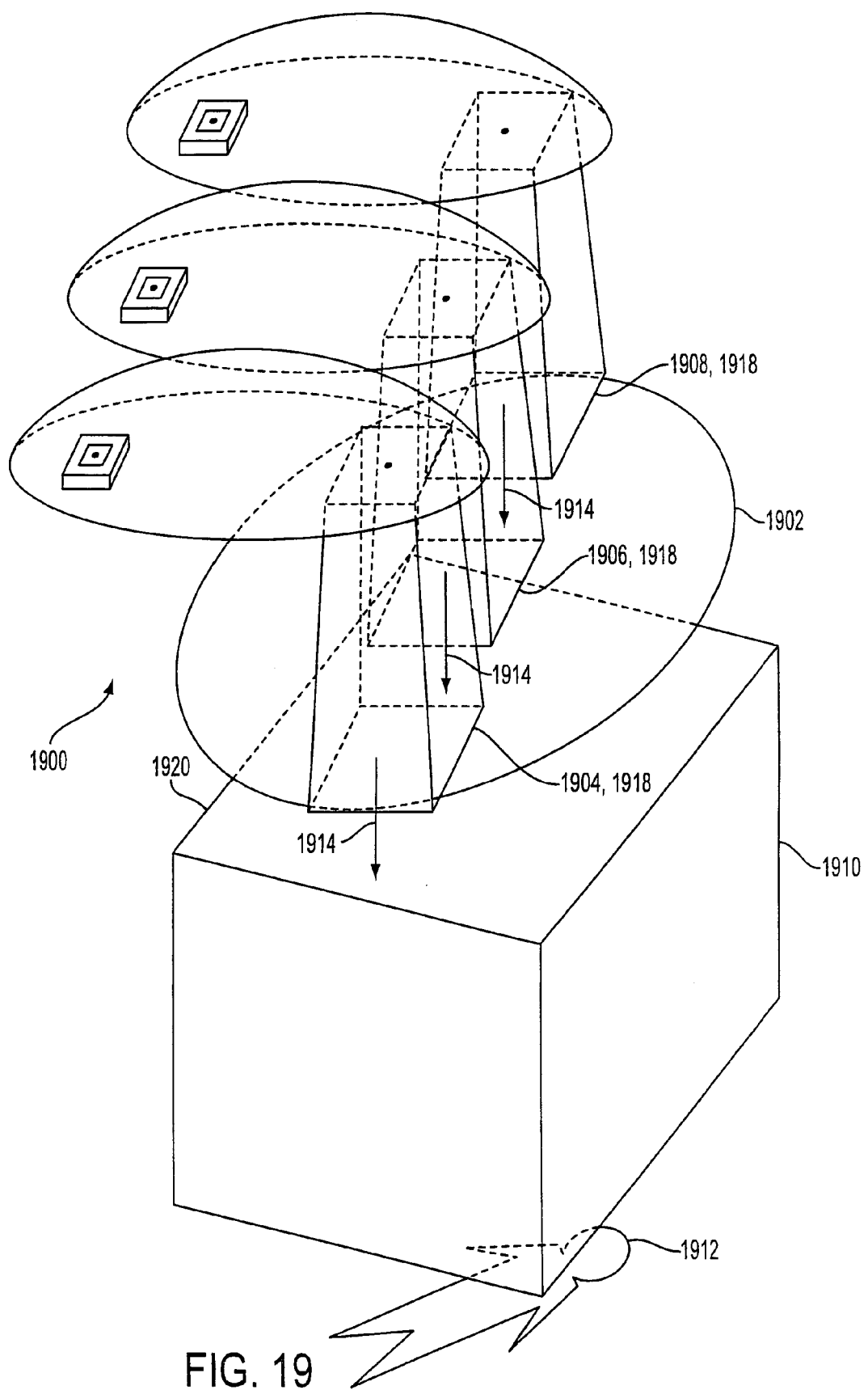
In FIG. 19 is shown a condenser lens and an image projection system for use with the fifth or the sixth embodiment of the invention.

In FIG. 19 is shown an illumination engine 1900 according to the fifth or the sixth embodiment of the invention with a condenser lens 1902 disposed substantially proximate to first, second and third output ends 1904, 1906 and 1908 and an image projection system 1910 disposed substantially proximate to an output side of condenser lens 1902. Projection system 1910 may display an image 1912 being illuminated by the radiation 1914 transmitted at first, second and third output ends 1904, 1906 and 1908.

In one embodiment, a first etendue 1918 is associated with first, second and third output ends 1904, 1906 and 1908, while a second etendue 1920 is associated with condenser lens 1902, such that first etendue 1918 is substantially equal to second etendue 1920.

In a preferred embodiment, sequential color will be used with a single imager chip. In this case, red, green, and blue LEDs will be turned on and off sequentially, and the color signal will be fed into the imager of the projection system 1910 in synchronism with the LEDs such that the output picture on the screen will be sequentially illuminated with the three colors. The retention of the eye will merge the colors and give an overall color picture. This has an effect that is similar to the sequential color system using color wheels. In that case, the lamp emits white light and the color is generated by the rotation of the color wheel, which introduces loss in the system and increase the size of the system.

The output from a homogenizer may then be used by the projection system to project the image onto the screen. The small power dissipation of the LED array and its long lifetime make this a very suitable light source for projection displays.

Figure 20:
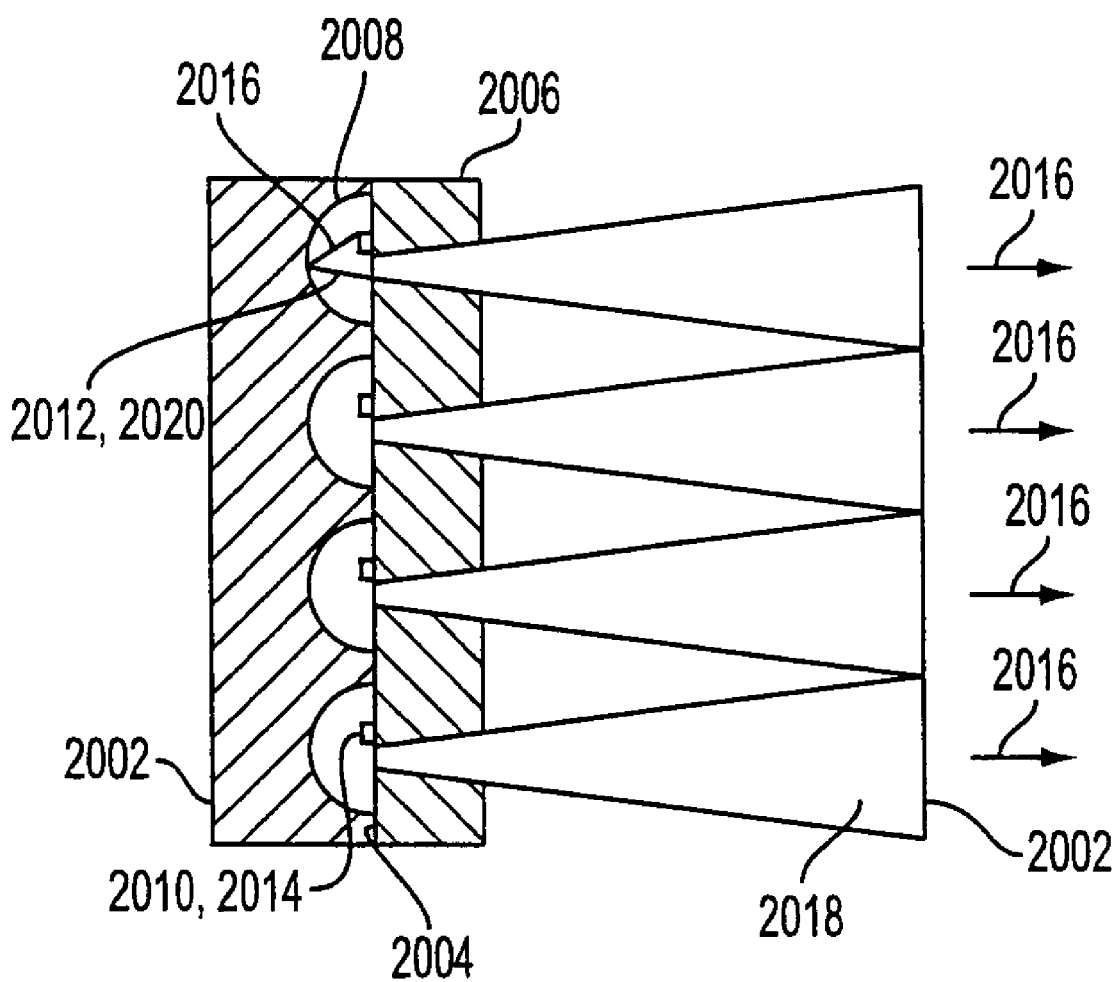
In FIG. 20 is shown an illumination system according to a seventh embodiment of the invention.

In FIG. 20 is shown an illumination system according to a seventh embodiment of the invention. In the seventh embodiment a platform 2002 is disposed proximate to a first side 2004 of a substrate 2006. Substrate 2006 may be formed substantially of, e.g. beryllium oxide (BeO). A plurality of reflectors 2008, each having a first and second focal points 2010, 2012, are disposed in platform 2002, with each of first and second focal points 2010, 2012 disposed proximate to first side 2004 of substrate 2006. The reflectors may, e.g. be made individually and assembled together, or more preferably, made into a common platform by machining or glass molding. A proper reflector coating such as, e.g. a cold coating can be deposited into the platform.

A plurality of sources of electro-luminescence 2014 are disposed on first side 2004 of substrate 2006. Each of sources of electro-luminescence 2014 are disposed substantially coincident with a corresponding one of first focal points 2010 to emit rays of electromagnetic radiation 2016 that reflect from a corresponding one of plurality of reflectors 2008 and converge substantially at a corresponding one of second focal points 2012. Reflectors 2008 may be, e.g. elliptical, spherical, toroidal, or dual-paraboloid reflectors. In one embodiment, the plurality of sources of electro-luminescence 2014 is between ten and thirty. In another embodiment, the plurality of sources of electro-luminescence 2014 are arranged in two-dimensional array such as, e.g. 2 by 2, 2 by 3, 3 by 3, 3 by 4, etc., and in general m by n, where m and n are integers. The output face 2002 of the light pipe can be square or rectangular or other shapes as shown in FIG. 27.

A plurality of light pipes 2018, each having an input end 2020 and an output end 2022, are disposed in substrate 2006, with each of input ends 2020 disposed substantially coincident with a corresponding one of second focal points 2012 to collect substantially all of radiation 2016 from a corresponding one of sources of electro-luminescence 2014. Each of output ends 2022 then transmits substantially all of radiation 2016 emitted by a corresponding one of plurality of sources 2014.

Figure 22:
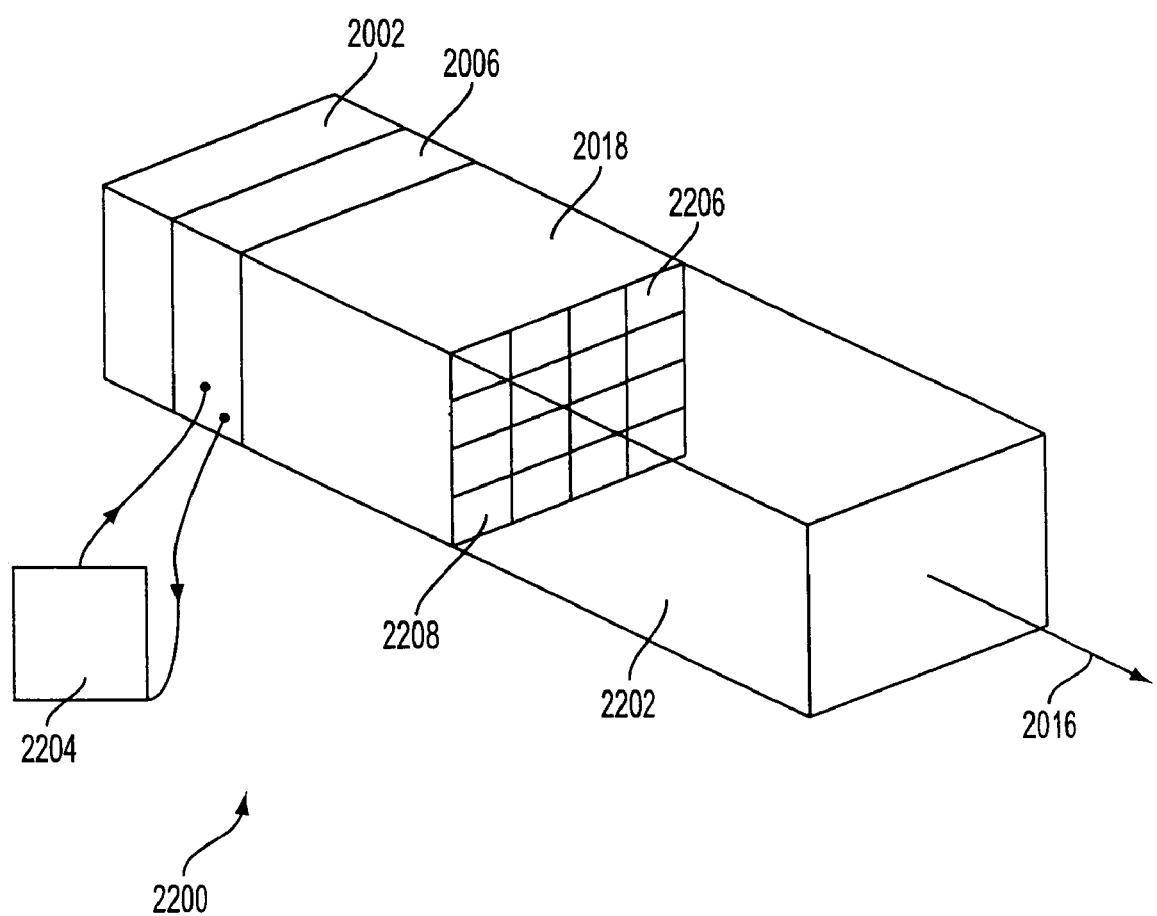
In FIG. 22 is shown an homogenizer for use with the seventh or the eighth embodiment of the invention.
Figure 31:
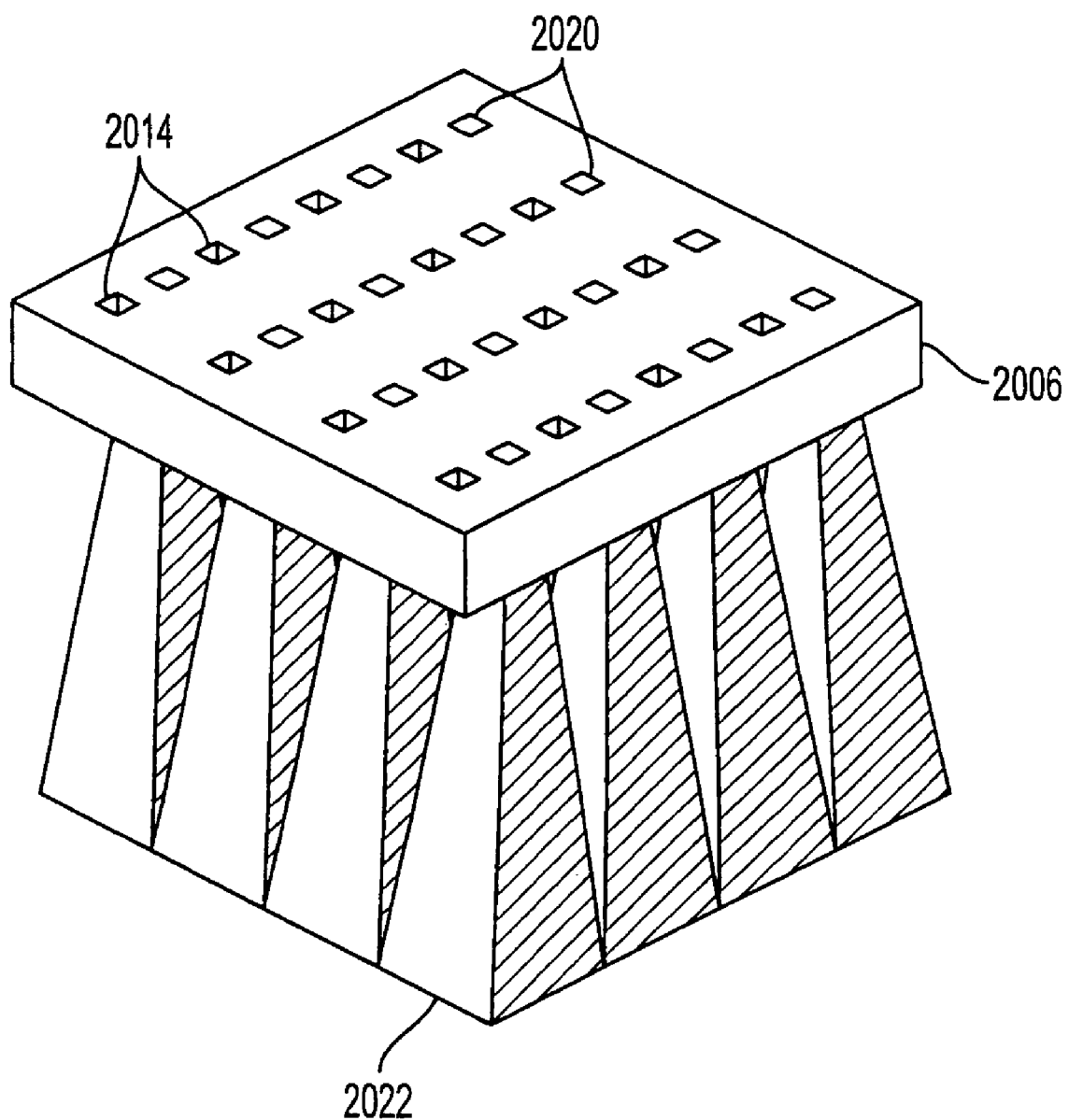

Holes are made in substrate 2006 for light pipes 2018 such that the sources of electro-luminescence 2014 and input ends 2020 are matched to the corresponding foci of the reflectors. The tapering of light pipes 2018 provides a transformation of the high numerical aperture (NA) at the input to a lower NA at the output. Also, for best performance, the outputs of light pipes 2018 are made such that they occupy the space at the output plane without gaps. This allows the smallest etendue at the output for further coupling of light. When the platform and substrate are assembled together, it becomes a compact illumination unit as shown in FIG. 31. The output ends of the light pipes may be made convex for, e.g. more efficient transformation of NA. A homogenizer 2202 may be added to mix the light input, as shown in FIG. 22, as well as a power source 2204. Homogenizer 2202 can be straight or tapered, either larger or smaller, to fit the particular application. The mixing of light homogenizes the spatial uniformity, and also the color when colored LEDs are used, e.g. red, green, and blue.

In one embodiment, a first etendue 2206 is associated with plurality of output ends 2022, while a second etendue 2208 is associated with homogenizer 2202, such that first etendue 2206 is substantially equal to second etendue 2208. A cross-section of homogenizer 2202 may be, e.g. a circle, or a polygon, as shown in FIG. 30. In another embodiment, homogenizer 2202 may be, e.g. a straight or a tapered homogenizer, as shown in FIG. 26. Homogenizer 2202 may be made of, e.g. quartz, glass, plastic, or acrylic.

Sources of electro-luminescence 2014 may be, e.g. sources of injection electro-luminescence, such as a forward-biased p-n junction, or a light-emitting diode. Radiation 2016 may be, e.g. recombination radiation. Output ends 2022 may be, e.g. substantially convex. Sources of electro-luminescence 2014 may each, e.g. output a range of wavelengths 2024 which may be, e.g. white radiation, infrared radiation, red radiation, orange radiation, yellow radiation, green radiation, blue radiation, indigo radiation, violet radiation, and ultraviolet radiation.

Each of plurality of light pipes 2018 may be, e.g. a tapered light pipe or a straight light pipe, as shown in FIG. 26. A cross-section of each of plurality of light pipes 2018 may be, e.g. a rectangle, a circle, a triangle, a rhombus, a trapezoid, a pentagon, a hexagon, or an octagon, as shown in FIG. 27.

Each of plurality of reflectors 2008 may be, e.g. at least a portion of a substantially ellipsoidal surface of revolution, at least a portion of a substantially toroidal surface of revolution, at least a portion of a substantially spheroidal surface of revolution, or at least a portion of a substantially dual paraboloidal surface of revolution. In one embodiment, each of plurality of reflectors 2008 has a coating that reflects only a pre-specified portion of the electromagnetic radiation spectrum, such as, e.g. visible light radiation, a pre-specified band of radiation, or a specific color of radiation.

Figure 21:
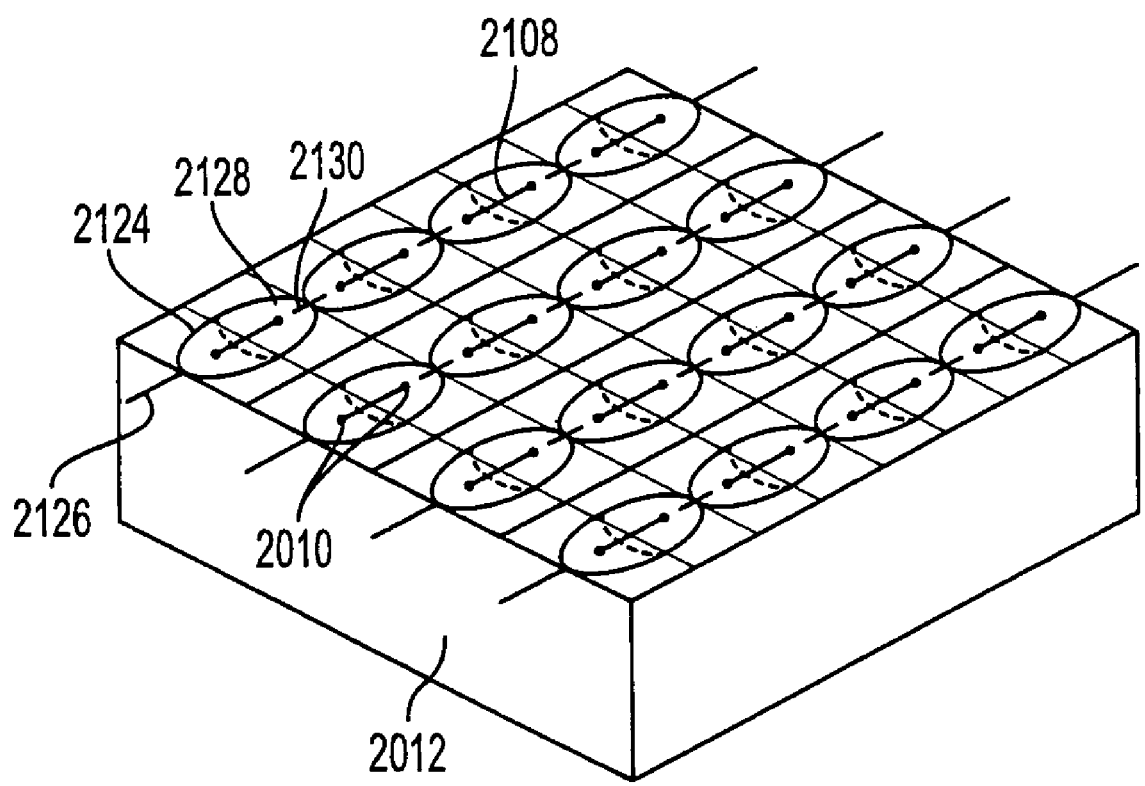
In FIG. 21 is shown an illumination system according to an eighth embodiment of the invention.

In FIG. 21 is shown a plurality of reflectors for use with an eighth embodiment of the invention. In the eighth embodiment, each of plurality of reflectors 2108 comprises a primary reflector 2124 having a first optical axis 2126 and a secondary reflector 2128 having a second optical axis 2130. Each of secondary reflectors 2128 is placed substantially symmetrically to a corresponding one of primary reflectors 2124 such that first and second optical axes 2126, 2130 are substantially collinear. Each of first focal points 2010 is a focal point of a corresponding one of primary reflectors 2124 and each of second focal points 2012 is a focal point of a corresponding one of secondary reflectors 2128.

Figure 23:
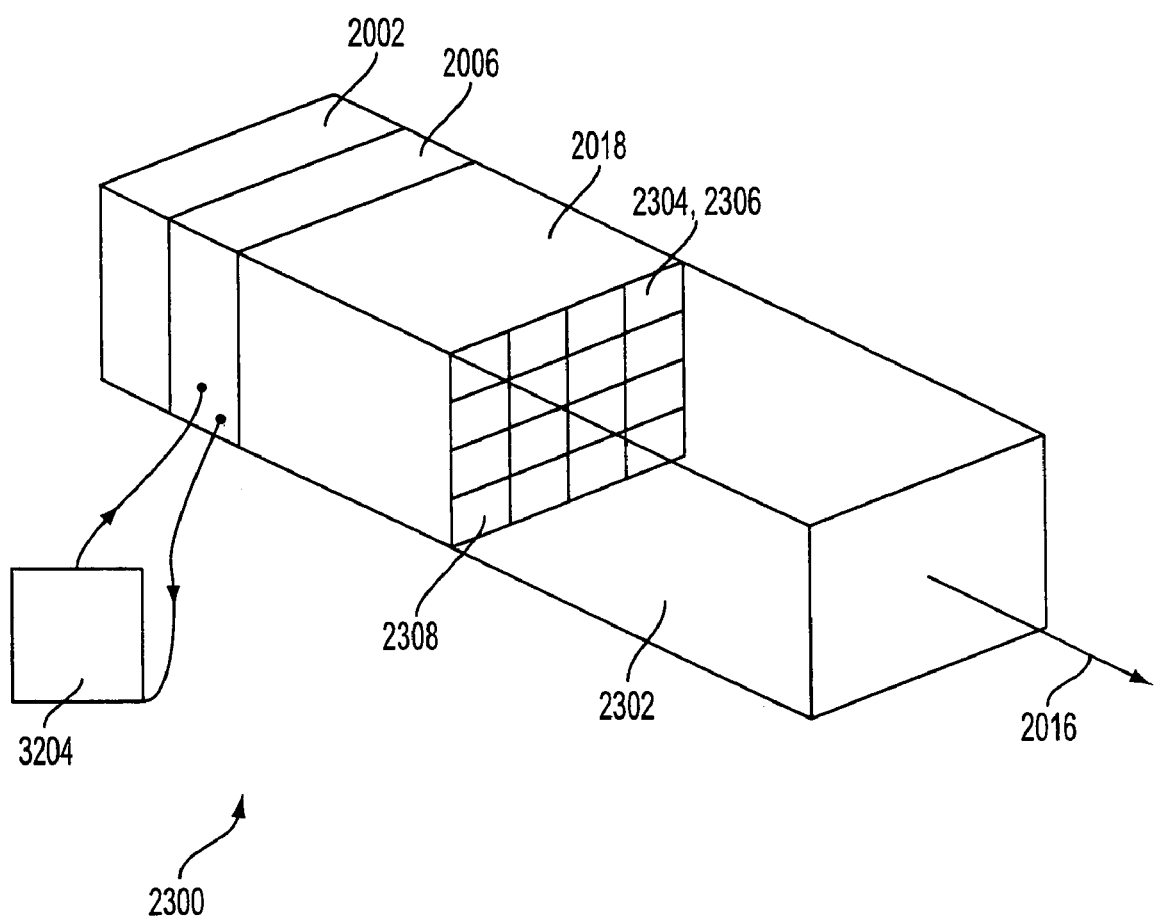
In FIG. 23 is shown a waveguide for use with the seventh or the eighth embodiment of the invention.

Primary reflector and secondary reflector 2124, 2128 may be, e.g. at least a portion of a substantially paraboloidal surface of revolution. In one embodiment, primary reflector 2124 comprises at least a portion of a substantially ellipsoidal surface of revolution, and secondary reflector 2128 comprises at least a portion of a substantially hyperboloidal surface of revolution. In another embodiment primary reflector 2124 comprises at least a portion of a substantially hyperboloidal surface of revolution, and secondary reflector 2128 comprises at least a portion of a substantially ellipsoidal surface of revolution. Of course, primary reflector and secondary reflector 2124, 2128 may be, e.g. a single reflector, which may be, e.g. at least a portion of a substantially ellipsoidal surface of revolution, at least a portion of a substantially toroidal surface of revolution, at least a portion of a substantially spheroidal surface of revolution, or at least a portion of a substantially dual paraboloidal surface of revolution In FIG. 23 is shown an illumination engine 2300 according to the seventh or the eighth embodiment of the invention with a waveguide 2302 disposed substantially proximate to plurality of output ends 2304. Waveguide 2302 may be, e.g. a single core optic fiber, a fiber bundle, a fused fiber bundle, a polygonal rod, or a hollow reflective light pipe, as shown in FIG. 28.

In one embodiment, a first etendue 2306 is associated with plurality of output ends 2304, while a second etendue 2308 is associated with homogenizer 2302, such that first etendue 2306 is substantially equal to second etendue 2308. A cross-section of waveguide 2302 may be, e.g. a circle, or a polygon, as shown in FIG. 29. In another embodiment, waveguide 2302 may be a tapered waveguide. Waveguide 2302 may be made of, e.g. quartz, glass, plastic, or acrylic.

Figure 24:
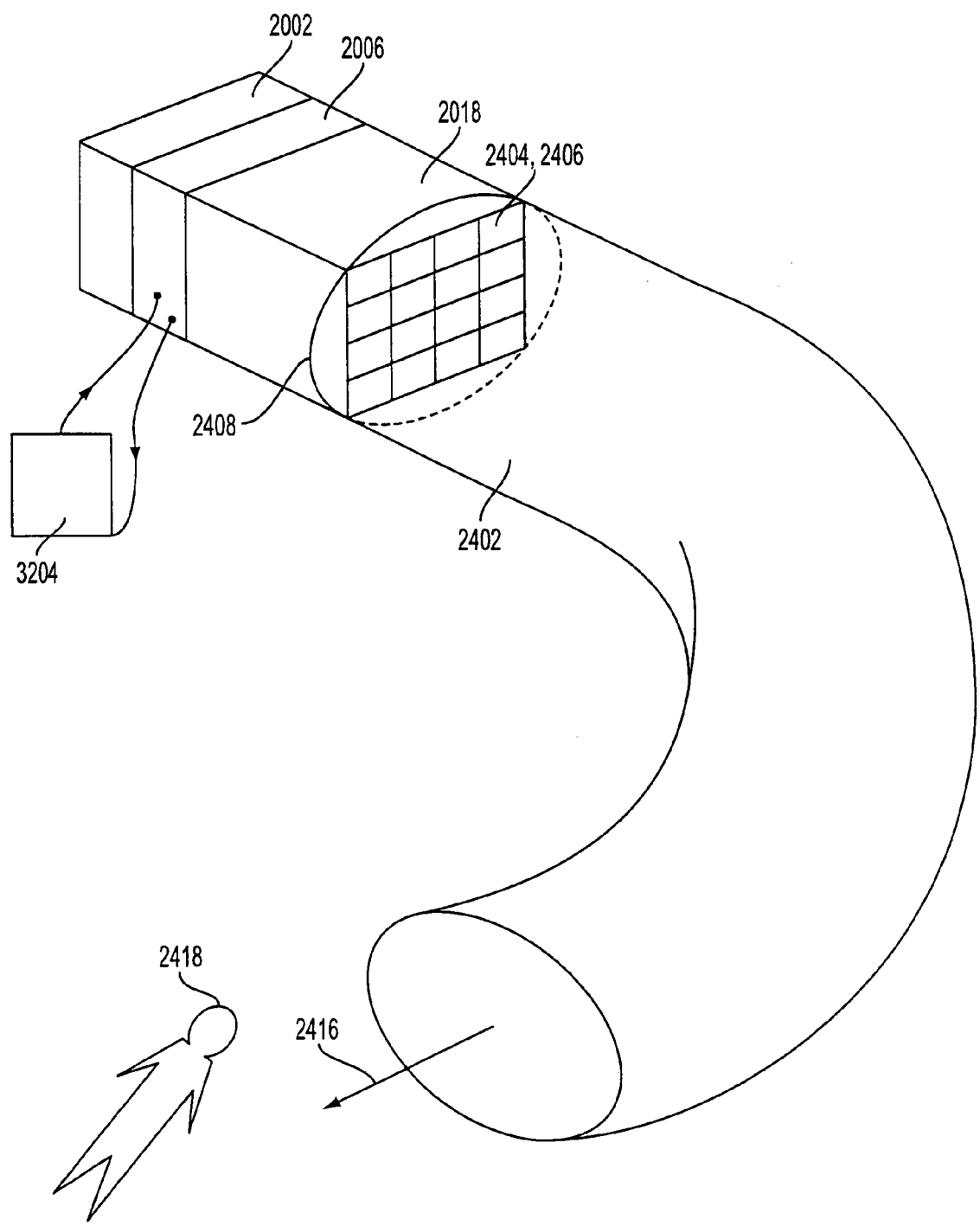
In FIG. 24 is shown a fiber optic for use with the seventh or the eighth embodiment of the invention.

In FIG. 24 is shown an illumination engine 2400 according to the seventh or the eighth embodiment of the invention with a fiber optic 2402 disposed substantially proximate to plurality of output ends 2404. Fiber optic 2402 may be illuminated by radiation 2416 transmitted at plurality of output ends 2404, the fiber optic 2402 releasing the collected and condensed radiation 2416 to provide for illumination at a desired location 2418.

In one embodiment, a first etendue 2406 is associated with plurality of output ends 2404, while a second etendue 2408 is associated with fiber optic 2402, such that first etendue 2406 is substantially equal to second etendue 2408.

Figure 25:
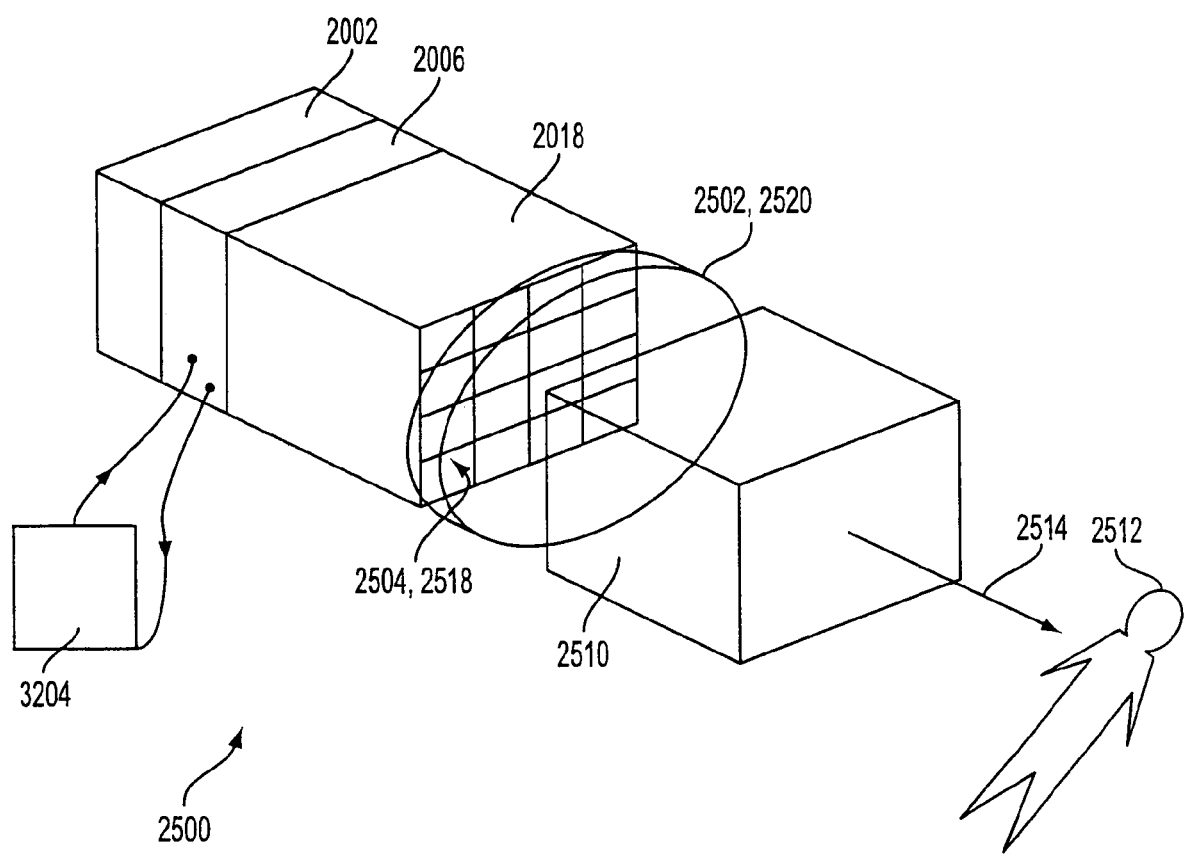
In FIG. 25 is shown a condenser lens and an image projection system for use with the seventh or the eighth embodiment of the invention.

In FIG. 25 is shown an illumination engine 2500 according to the seventh or the eighth embodiment of the invention with a condenser lens 2502 disposed substantially proximate to plurality of output ends 2504 and an image projection system 2510 disposed substantially proximate to an output side of condenser lens 2502. Projection system 2510 may display an image 2512 being illuminated by the radiation 2514 transmitted at plurality of output ends 2504. An additional light pipe may be placed between the plurality of output ends 2504 and the condenser lens 2502 for improved uniformity of the output.

In one embodiment, a first etendue 2518 is associated with plurality of output ends 2504, while a second etendue 2520 is associated with condenser lens 2502, such that first etendue 2518 is substantially equal to second etendue 2520.

In a tenth embodiment of the invention, a method of illumination comprises the steps of i) positioning a source of electro-luminescent radiation at a first focal point of a reflector, ii) producing rays of radiation by the source, iii) reflecting the rays of radiation by the reflector toward a second focal point of the reflector, iv) converging the rays of radiation at second focal point, v) positioning a light pipe having an input end and output end so the input end is substantially proximate to the second focal point, vi) collecting the rays of radiation at the input end, vii) passing the rays of radiation through the light pipe, and vii) outputting the rays of radiation from the output end of the light pipe.

While the invention has been described in detail above, the invention is not intended to be limited to the specific embodiments as described. It is evident that those skilled in the art may now make numerous uses and modifications of and departures from the specific embodiments described herein without departing from the inventive concepts.

What is claimed is:

1. An illumination engine, comprising:
   an array of light pipes, each having an input end and an output end; and
   an array of light-emitting diodes (LEDs), each LED being associated with an input end of a different light pipe in said array of light pipes and emitting rays of radiation to said input end of said different light pipe;
   a plurality of coupling elements between said array of the LEDs and the input ends of said array of light pipes; and
   wherein an output end of each light pipe transmits substantially all of said radiation collected by an input end of said each light pipe.

2. The illumination engine of claim 1, wherein said each light pipe is a tapered light pipe.

3. The illumination engine of claim 1, further comprising a plurality of waveguides, each waveguide disposed substantially proximate to an output end of said different light pipe.

4. The illumination engine of claim 1, wherein said output end of said each light pipe is substantially convex.

5. The illumination engine of claim 1, wherein said output ends of said array of light pipes are closely packed.

6. The illumination engine of claim 1, wherein said input and output ends of said array of light pipes are hexagonal in shape.

7. The illumination engine of claim 6, wherein said output ends of said array of light pipes axe closely packed.

8. The illumination engine of claim 1, wherein said coupling elements are concave reflectors.

9. The illumination engine of claim 1, wherein each LED of said LED array is placed proximally next to the input end of each light pipe of said array of light pipes.

10. The illumination engine of claim 9, further comprising a clear epoxy lens packed with said each LED in said array of LEDs.

* * * * *